(12) United States Patent
Park et al.

(10) Patent No.: US 10,528,166 B2
(45) Date of Patent: Jan. 7, 2020

(54) FLEXIBLE DISPLAY DEVICE AND METHOD OF MANUFACTURING THE SAME

(71) Applicant: Samsung Display Co., Ltd., Yongin-si (KR)

(72) Inventors: Mi-ae Park, Hwaseong-si (KR); Sungku Kang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 288 days.

(21) Appl. No.: 15/493,394

(22) Filed: Apr. 21, 2017

(65) Prior Publication Data

US 2017/0315645 A1 Nov. 2, 2017

(30) Foreign Application Priority Data

Apr. 27, 2016 (KR) .................. 10-2016-0051583

(51) Int. Cl.
*G06F 3/041* (2006.01)
*H01L 51/00* (2006.01)
*H01L 27/32* (2006.01)

(52) U.S. Cl.
CPC .......... *G06F 3/0412* (2013.01); *H01L 27/323* (2013.01); *H01L 51/0097* (2013.01); *G06F 2203/04102* (2013.01)

(58) Field of Classification Search
CPC combination set(s) only.
See application file for complete search history.

(56) References Cited

U.S. PATENT DOCUMENTS

| 9,122,088 | B2* | 9/2015 | Omote | G06F 3/044 |
| 10,168,844 | B2* | 1/2019 | Kwon | H01L 51/5256 |
| 2009/0051640 | A1* | 2/2009 | Tanaka | G02F 1/136286 345/92 |
| 2013/0002569 | A1* | 1/2013 | Kang | G06F 3/044 345/173 |

(Continued)

FOREIGN PATENT DOCUMENTS

| KR | 10-2008-0035709 | 4/2008 |
| KR | 10-1493412 | 2/2015 |
| KR | 10-2015-0062528 | 6/2015 |

*Primary Examiner* — Patrick N Edouard
*Assistant Examiner* — Peijie Shen
(74) *Attorney, Agent, or Firm* — H.C. Park & Associates, PLC

(57) ABSTRACT

A flexible display device including a display panel configured to display an image and including first and second bending areas configured to be bent along first and second folding axes, respectively, and a touch sensing unit disposed on the display panel. The touch sensing unit includes a base insulation layer, a first touch electrode part disposed on a first surface of the base insulation layer and overlapping the first bending area to detect an external input, and a second touch electrode part disposed on a second, opposing surface of the base insulation layer and overlapping the second bending area to detect an external input. A portion of the display panel is disposed between the first folding axis and the touch sensing unit, and a portion of the touch sensing unit is disposed between the second folding axis and the display panel, when the flexible display device is bent.

19 Claims, 22 Drawing Sheets

(56) References Cited

U.S. PATENT DOCUMENTS

| | | | | |
|---|---|---|---|---|
| 2013/0265257 A1* | 10/2013 | Jung | ............... | G06F 3/0412 |
| | | | | 345/173 |
| 2013/0293096 A1* | 11/2013 | Kang | ............... | H01H 1/10 |
| | | | | 313/511 |
| 2014/0069796 A1* | 3/2014 | Kang | ............... | G06F 1/16 |
| | | | | 200/600 |
| 2015/0022731 A1* | 1/2015 | Kang | ............... | G06F 3/044 |
| | | | | 349/12 |
| 2015/0022732 A1 | 1/2015 | Park | | |
| 2015/0062028 A1* | 3/2015 | Go | ............... | G06F 1/1616 |
| | | | | 345/173 |
| 2015/0293629 A1* | 10/2015 | Ryu | ............... | G06F 3/044 |
| | | | | 345/174 |
| 2015/0346866 A1* | 12/2015 | Kusunoki | ............... | G06F 3/044 |
| | | | | 345/174 |
| 2016/0028032 A1* | 1/2016 | Okada | ............... | H01L 51/0097 |
| | | | | 257/40 |
| 2016/0147362 A1* | 5/2016 | Eim | ............... | G06F 1/1641 |
| | | | | 345/173 |
| 2016/0188098 A1* | 6/2016 | Her | ............... | G06F 1/1652 |
| | | | | 345/173 |
| 2017/0068275 A1* | 3/2017 | Lee | ............... | G06F 1/1652 |
| 2017/0115801 A1* | 4/2017 | Shih | ............... | G06F 3/0412 |
| 2017/0131809 A1* | 5/2017 | Lin | ............... | G06F 3/044 |
| 2017/0194409 A1* | 7/2017 | Jeong | ............... | H01L 27/1218 |
| 2017/0277291 A1* | 9/2017 | Lee | ............... | G02B 5/3083 |
| 2017/0277322 A1* | 9/2017 | Lee | ............... | G06F 3/044 |
| 2019/0086059 A1* | 3/2019 | Hirakata | ............... | F21V 15/012 |

\* cited by examiner

FLEXIBLE DISPLAY DEVICE AND METHOD OF MANUFACTURING THE SAME

CROSS-REFERENCE TO RELATED APPLICATION

This application claims priority from and the benefit of Korean Patent Application No. 10-2016-0051583, filed on Apr. 27, 2016, which is hereby incorporated by reference for all purposes as if fully set forth herein.

BACKGROUND

Field

Exemplary embodiments relate to a flexible display device. More particularly, exemplary embodiments relate to a flexible display device capable of being bent multiple times.

Discussion of the Background

Various kinds of electronic equipment, such as smartphones, digital cameras, notebook computers, navigation units, and smart televisions are being developed. Each of the kinds of electronic equipment may include a display device for providing information.

As the various kinds of electronic equipment are developed to have various shapes, display devices are also being developed to have shapes that correspond to those of the electronic equipment. Electronic equipment may generally include a flat panel display device. However, there is a need in recent electronic equipment for a flexible display device, such as a curved display device, a bent display device, and a rolled display device. In addition, consumers may desire for a kind of electronic equipment that can be bent multiple times or bendable with respect to various axes. As such, the need for functional members is increasing.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible display device including a touch sensing unit capable of preventing cracks in an electrode from tension/compression stress that may occur from multiple bending.

Additional aspects will be set forth in the detailed description which follows, and, in part, will be apparent from the disclosure, or may be learned by practice of the inventive concept.

According to an exemplary embodiment, a flexible display device includes a display panel configured to display an image and including a first bending area and a second bending area, the first bending area and the second bending area being configured to be bent along a first folding axis and a second folding axis, respectively, and a touch sensing unit disposed on the display panel. The touch sensing unit includes a base insulation layer, a first touch electrode part disposed on a first surface of the base insulation layer and overlapping the first bending area to detect an external input, and a second touch electrode part disposed on a second, opposing surface of the base insulation layer and overlapping the second bending area to detect an external input, in which a portion of the display panel is disposed between the first folding axis and the touch sensing unit, and a portion of the touch sensing unit is disposed between the second folding axis and the display panel, when the flexible display device is bent.

The first touch electrode part may include first conductive patterns that do not overlap the second bending area, and the second touch electrode part may include second conductive patterns that do not overlap the first bending area.

Each of the first and second conductive patterns may include a plurality of electrodes arranged in a matrix shape on a plane defined by a first direction and a second direction perpendicular to the first direction.

Each of the first and second conductive patterns may have a mesh shape and include a plurality of openings.

The first conductive patterns may include first touch electrodes extending in a first direction and arranged in a second direction perpendicular to the first direction, and second touch electrodes extending in the second direction, arranged in the first direction, and insulated from the first touch electrodes. The second conductive patterns may include third touch electrodes extending in the first direction and arranged in the second direction, and fourth touch electrodes extending in the second direction, arranged in the first direction, and insulated from the third touch electrodes.

The first touch electrodes and the second touch electrodes may be disposed on different layers from each other in a third direction perpendicular to a plane defined by the first and second directions, and the third touch electrodes and the fourth touch electrodes may be disposed on different layers different from each other in the third direction.

The touch sensing unit may further include a circuit board disposed on the base insulation layer, first signal lines connected to the first conductive patterns, respectively, and second signal lines connected to the second conductive patterns, respectively. The first and second signal lines may each be connected to the circuit board.

The first signal lines may overlap the first and second bending areas, and the second signal lines may not overlap the first bending area and overlap the second bending area.

The circuit board may include a first circuit board disposed on a first side of the base insulation layer and a second circuit board disposed on a second side facing the first side of the base insulation layer, each of the first signal lines may be connected to the first circuit board, and each of the second signal lines may be connected to the second circuit board.

The touch sensing unit may further include first electrode patterns disposed on the first surface of the base insulation layer, overlapping the second bending area, extending in the first direction, and arranged in the second direction, and second electrode patterns disposed on the second surface of the base insulation layer, overlapping the first bending area, extending in the first direction, and arranged in the second direction.

The first electrode patterns may have an integral shape with the first touch electrodes, respectively, and the second electrode patterns may have an integral shape with the second touch electrodes, respectively.

The first electrode patterns may not overlap the third touch electrodes in a third direction perpendicular to a plane defined by the first and second directions, and the second electrode patterns may not overlap the first touch electrodes in the third direction.

According to an exemplary embodiment, a flexible display device includes a display panel including a base substrate, a circuit layer disposed on the base substrate, a device layer disposed on the circuit layer, and an encapsulation layer covering the device layer, in which the display panel has a first bending area configured to be bent along a first folding axis and a second bending area configured to be bent along a second folding axis, first conductive patterns disposed on the encapsulation layer and overlapping the first bending area and not overlapping the second bending area, a base insulation layer configured to cover the first conductive patterns, and a touch sensing unit including second conductive patterns disposed on the base insulation layer and overlapping the second bending area and not overlapping the first bending area. A portion of the display panel is disposed between the first folding axis and the touch sensing unit, and a portion of the touch sensing unit is disposed between the second folding axis and the display panel, when the flexible display device is bent.

The flexible display device may further include an adhesion layer disposed between the encapsulation layer and the first conductive patterns.

The first conductive patterns may include first touch electrodes extending in a first direction and arranged in a second direction perpendicular to the first direction, and second touch electrodes extending in the second direction and arranged in the first direction. The second conductive patterns may include third touch electrodes extending in the first direction and arranged in the second direction, and fourth touch electrodes extending in the second direction and arranged in the first direction.

The first touch electrodes and the second touch electrodes may be disposed on different layers different from each other in a third direction perpendicular to a plane defined by the first and second directions, and the third touch electrodes and the fourth touch electrodes may be disposed on different layers different from each other in the third direction.

The touch sensing unit may further include first electrode patterns disposed between the encapsulation layer and the base insulation layer, overlapping the second bending area, extending in the first direction, and arranged in the second direction, and second electrode patterns disposed on the base insulation layer, overlapping the first bending area, extending in the first direction, and arranged in the second direction.

The first electrode patterns may not overlap the third touch electrodes in a third direction perpendicular to a plane defined by the first and second directions, and the second electrode patterns may not overlap the first touch electrodes in the third direction.

According to an exemplary embodiment, a method of manufacturing a flexible display device includes providing a display panel, and forming a touch sensing unit on the display panel. Forming the touch sensing unit includes forming a base insulation layer including a first bending area and a second bending area, the first bending area configured to be bent along a first folding axis and a second bending area configured to be bent along a second folding axis, forming a first touch electrode part overlapping the first bending area on a first surface of the base insulation layer, and forming a second touch electrode part overlapping the second bending area on a second, opposing surface of the base insulation layer. A portion of the display panel is disposed between the first folding axis and the touch sensing unit, and a portion of the touch sensing unit is disposed between the second folding axis and the display panel, when the flexible display device is bent.

The method may further include forming an adhesion layer on the display panel, in which the adhesion layer adheres the display panel to the touch sensing unit.

The foregoing general description and the following detailed description are exemplary and explanatory and are intended to provide further explanation of the claimed subject matter.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept.

DETAILED DESCRIPTION OF THE ILLUSTRATED EMBODIMENTS

Figure 1A:
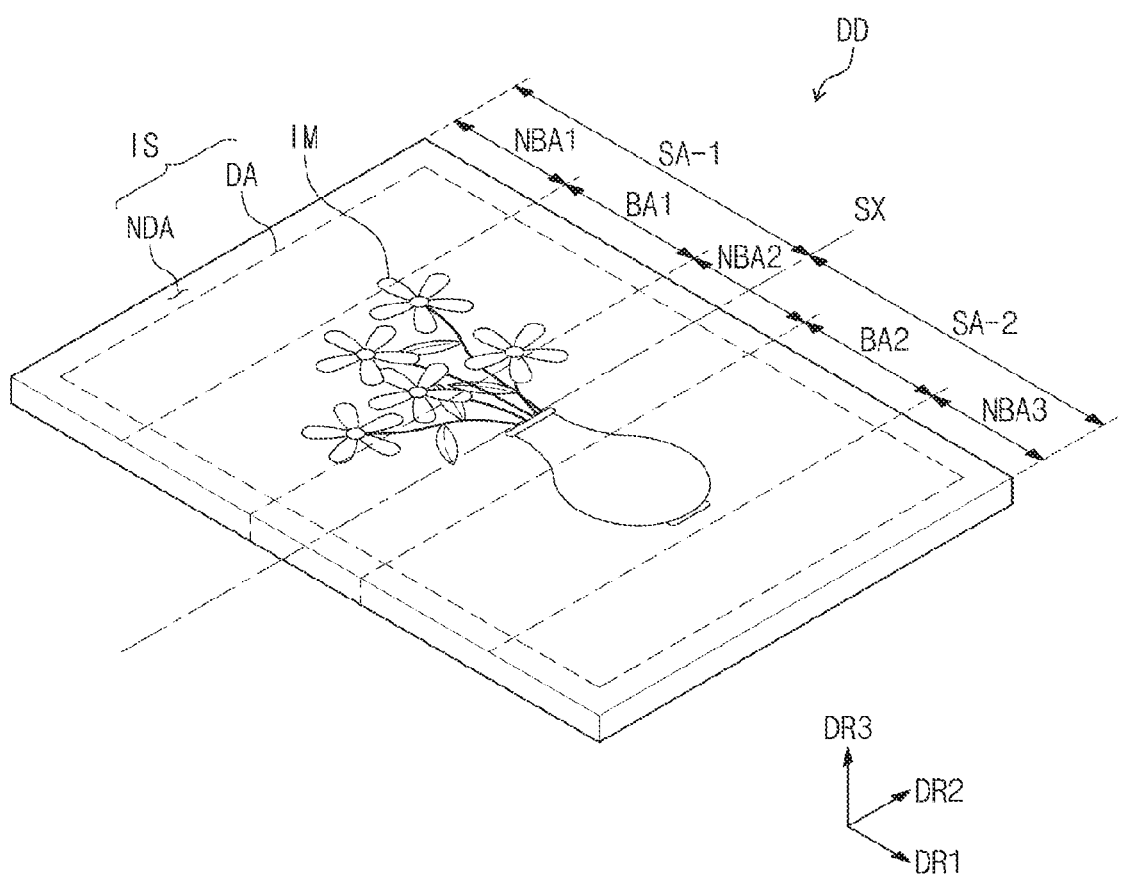
FIG. 1A is a perspective view illustrating a first operation of a flexible display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
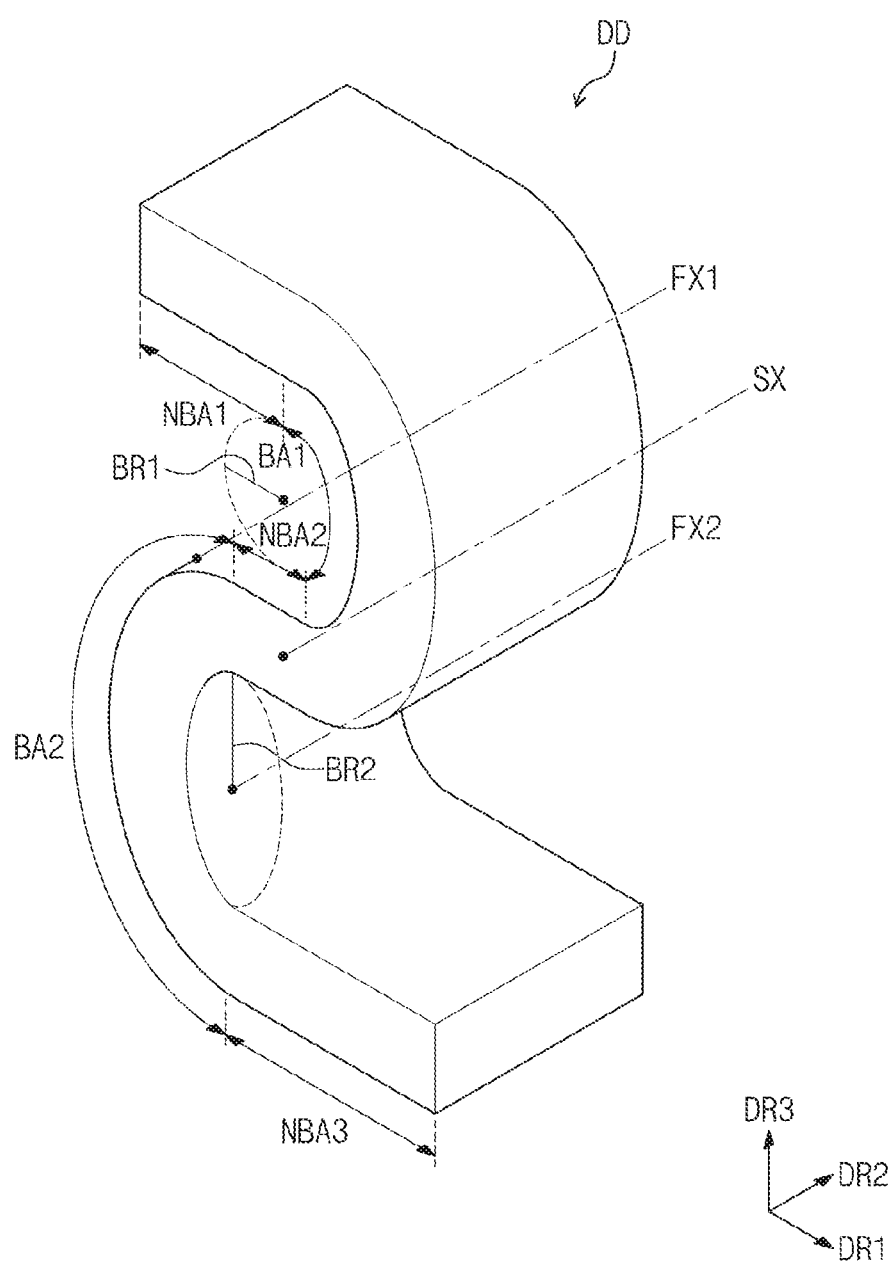
FIG. 1B is a perspective view illustrating a second operation of the flexible display device according to an exemplary embodiment.
Figure 2A:
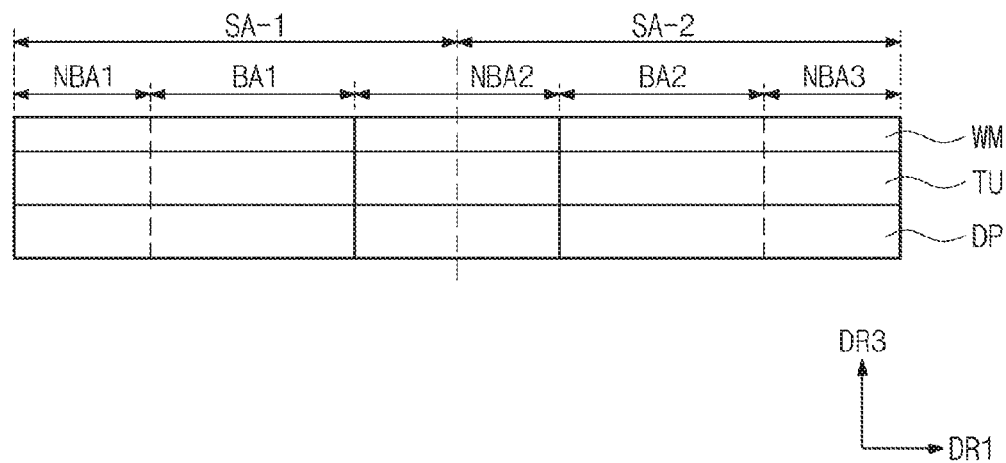
FIG. 2A is a cross-sectional view illustrating the first operation of the flexible display device according to an exemplary embodiment.
Figure 2B:
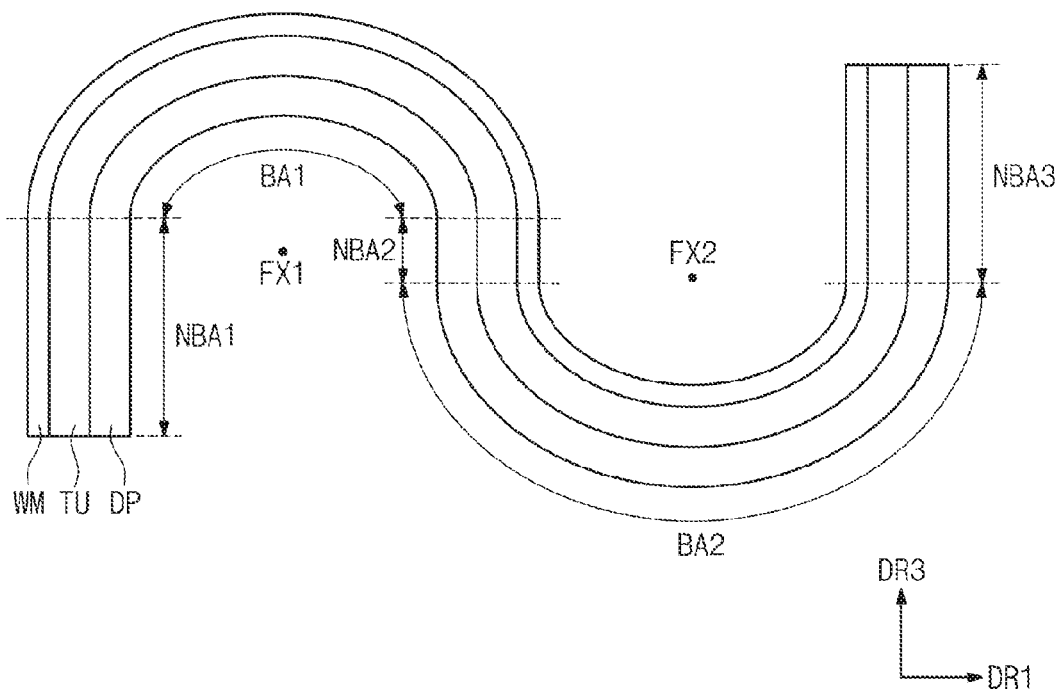
FIG. 2B is a cross-sectional view illustrating the second operation of the flexible display device according to an exemplary embodiment.

FIG. 1A is a perspective view illustrating a first operation of a flexible display device DD according to an exemplary embodiment. FIG. 1B is a perspective view illustrating a second operation of the flexible display device DD according to an exemplary embodiment. FIG. 2A is a cross-sectional view illustrating the first operation of the flexible display device DD according to an exemplary embodiment. FIG. 2B is a cross-sectional view illustrating the second operation of the flexible display device DD according to an exemplary embodiment.

Referring to FIG. 1A, a display surface IS, on which an image IM is displayed, is parallel to a surface defined by a first directional axis DR1 and a second directional axis DR2. A normal direction of the display surface IS (e.g., a thickness direction of the flexible display apparatus DD) is indicated as a third directional axis DR3. Front and rear surfaces of each member may be defined by the third directional axis DR3. However, directions indicated as the first, second, and third directional axes DR1, DR2, and DR3 may be a relative concept, and thus, may be changed into different directions. Hereinafter, the first to third directions may be directions indicated by the first to third directional axes DR1, DR2, and DR3 and designated with the same reference numerals, respectively.

FIGS. 1A to 2B illustrate a foldable display device, which may be bent with respect to two folding axes, as an example of the flexible display device DD. However, the inventive concept is not limited thereto. For example, the flexible display device DD may be a curved flexible display device having a predetermined curvature and a rollable flexible display device that is rollable. Although not separately illustrated, the flexible display device DD according to an exemplary embodiment may be used for large-sized electronic equipment, such as televisions and monitors, and small and middle-sized electronic equipment, such as mobile phones, tablet PC, navigation units for vehicles, game consoles, and smart watches.

As illustrated in FIG. 1A, the display surface IS of the flexible display device DD may be divided into a plurality of areas. The flexible display device DD includes a display area DA, on which the image IM is displayed, and a non-display area NDA that is adjacent to the display area DA. The non-display area NDA may be an area on which an image is not displayed. FIG. 1A illustrates a flower vase as an example of the image IM displayed. The display area DA may have a rectangular shape. The non-display area NDA may surround the display area DA. However, the inventive concept is not limited thereto. For example, the display area DA and the non-display area NDA may be relatively designed in shape.

As illustrated in FIGS. 1A and 1B, a first area SA-1 and a second area SA-2 may be defined on the flexible display device DD with respect to a predetermined reference axis SX. The first area SA-1 may be divided into a first bending area BA1 that may be bent with respect to a first folding axis FX1, a first non-bending area NBA1 disposed adjacent to the first bending area BA1, and a portion of the second non-bending area NBA2. The second area SA-2 may be divided into a second bending area BA2 that may be bent with respect to a second folding axis FX2, a portion of the second non-bending area NBA2 disposed adjacent to the second bending area BA2, and a third non-bending area NBA3.

The first bending area BA1 may be bent so that a portion of the display surface IS disposed within the first non-bending area NBA1 and a portion of the display surface IS disposed within the second non-bending area NBA2 face each other. In particular, the first area SA-1 may be bent inward with respect to the first folding axis FX1.

The second bending area BA2 may be bent so that a portion of the display surface IS disposed within the second non-bending area NBA2 and a portion of the display surface IS disposed within the third non-bending area NBA3 do not face each other. In particular, the second area SA-2 may be bent inward with respect to the second folding axis FX2. More particularly, as illustrated in FIG. 1B, in the flexible display device DD according to an exemplary embodiment, a portion of the display panel DP, on which the first bending area BA1 is defined, and a portion of the display panel DP, on which the second bending area BA2 is defined, may be bent to protrude in opposite directions along an axis parallel to the first direction DR1.

Each of the first and second bending areas BA1 and BA2 may not be fixed in size. For example, the first bending area BA1 may have a size equal to or less than that of the first area SA-1. Also, the second bending area BA2 may have a size equal to or less than that of the second area SA-2. Hereinafter, the flexible display device DD will be described as including the first bending area BA1 having a size less than that of the first area SA-1, and the second bending area BA2 having a size less than that of the second area SA-2.

The first and second bending areas BA1 and BA2 may have sizes that are determined by bending radii BR1 and BR2 illustrated in FIG. 1B, respectively. The first bending radius BR1 and the second bending radius BR2 may be set to be equal or different from each other.

As illustrated in FIGS. 2A and 2B, the flexible display device DD may include a display panel DP, a touch sensing unit TU, and a window member WM. Each of the display panel DP, the touch sensing unit TU, and the window member WM may have a flexible property. Although not separately shown, the display device DD may further include a protection member coupled to the window member WM to protect the display panel DP and the touch sensing unit TU. In an exemplary embodiment, the window member WM may be omitted or integrated with the touch sensing unit TU.

The display panel DP generates the image IM (see FIG. 1A) corresponding to input image data. The display panel DP may be an organic light emitting display panel, an electrophoretic display panel, or an electrowetting display panel. However, the inventive concept is not limited to a type of display panels utilized. Hereinafter, the flexible display panel DP will be described with reference to an organic light emitting display panel. The organic light emitting display panel will be described later in detail.

The touch sensing unit TU may obtain coordinate information of an external input. The touch sensing unit TU may be disposed on a base surface of the display panel DP. The touch sensing unit TU may operate in a capacitive manner. However, the inventive concept is not limited thereto. For example, the touch sensing unit may be a different type of touch sensing unit including two types of touch electrodes, which operates in a different manner, such as an electromagnetic induction manner.

The window member WM may include a plastic film. The window member WM may further include a fingerprint prevention layer, an antireflection layer, and a functional coating layer, such as a hard coating layer. Although not shown, the window member WM may be coupled to the touch sensing unit TU by an optically clear adhesive film.

As illustrated in FIG. 2B, according to an exemplary embodiment, a portion of the display panel DP may be disposed between the first folding axis FX1 and the touch sensing unit TU, and a portion of the touch sensing unit TU may be disposed between the second folding axis FX2 and the display panel DP, when the flexible display device DD is bent. More particularly, the flexible display device DD may be bent in an S shape.

Figure 3A:
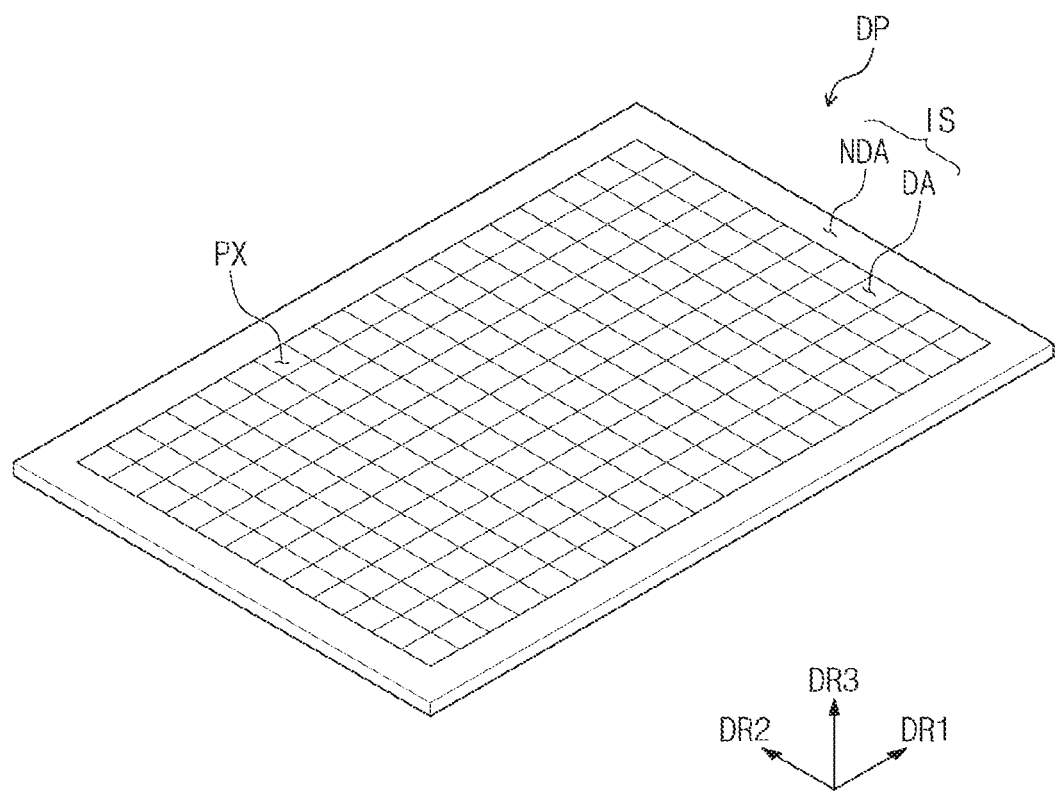
FIG. 3A is a perspective view of a flexible display panel according to an exemplary embodiment.
Figure 3B:
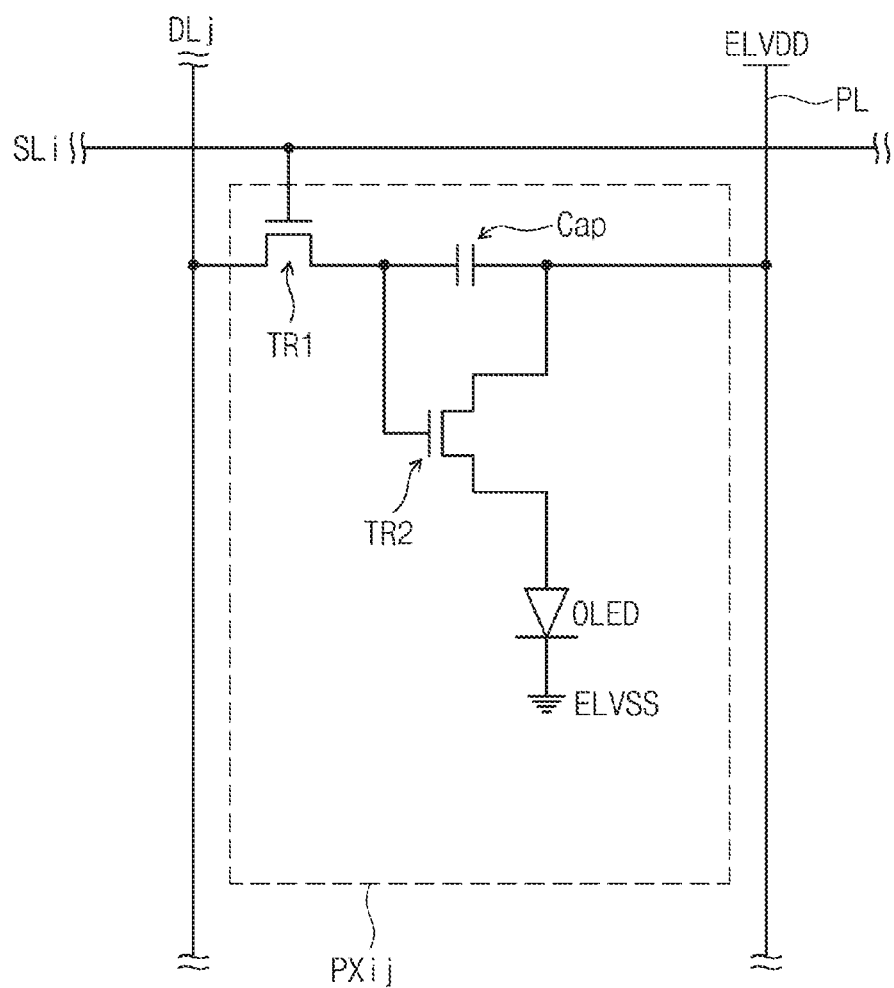
FIG. 3B is an equivalent circuit diagram of a pixel according to an exemplary embodiment.

FIG. 3A is a perspective view of the flexible display panel DP according to an exemplary embodiment. FIG. 3B is an equivalent circuit diagram of a pixel PX according to an exemplary embodiment. Hereinafter, the organic light emitting display panel DP will be described as an example of the flexible display panel DP. The organic light emitting display panel DP includes a display area DA and a non-display area NDA on a plane. The display area DA and the non-display area NDA of the organic light emitting display panel DP may be changed according to a structure/design of the organic light emitting display panel DP.

As illustrated in FIG. 3A, the organic light emitting display panel DP includes a plurality of pixels PX disposed on the display area DA. Although the pixels PX are illustrated as being arranged in a matrix form, however, the inventive concept is not limited thereto. For example, the pixels PX may be arranged in a non-matrix form, e.g., a pantile form.

FIG. 3B illustrates an equivalent circuit diagram of one pixel PX connected to an i-th scan line SL1 and a j-th source line DLj. Although not separately shown, the plurality of pixels PX may have the same equivalent circuit.

The pixel PXij includes at least one thin-film transistors TR1 and TR2, at least one capacitor Cap, and an organic light emitting device OLED. Although FIG. 3B illustrate a pixel driving circuit including two transistors TR1 and TR2 and one capacitor Cap as an example, however, the inventive concept is not limited to the configuration of the pixel driving circuit.

An anode of the organic light emitting device OLED receives a first power voltage ELVDD applied to the power line PL through the second transistor TR2. A cathode of the organic light emitting device OLED receives a second power voltage ELVSS. The first transistor TR1 outputs a data signal applied to a j-th source line DLj in response to a scanning signal applied to the i-th scan line SLi. The capacitor Cap charges a voltage to correspond to the data signal received from the first transistor TR1. The second transistor TR2 controls driving current flowing through the organic light emitting device OLED to correspond to a voltage stored in the capacitor Cap.

Figure 4:
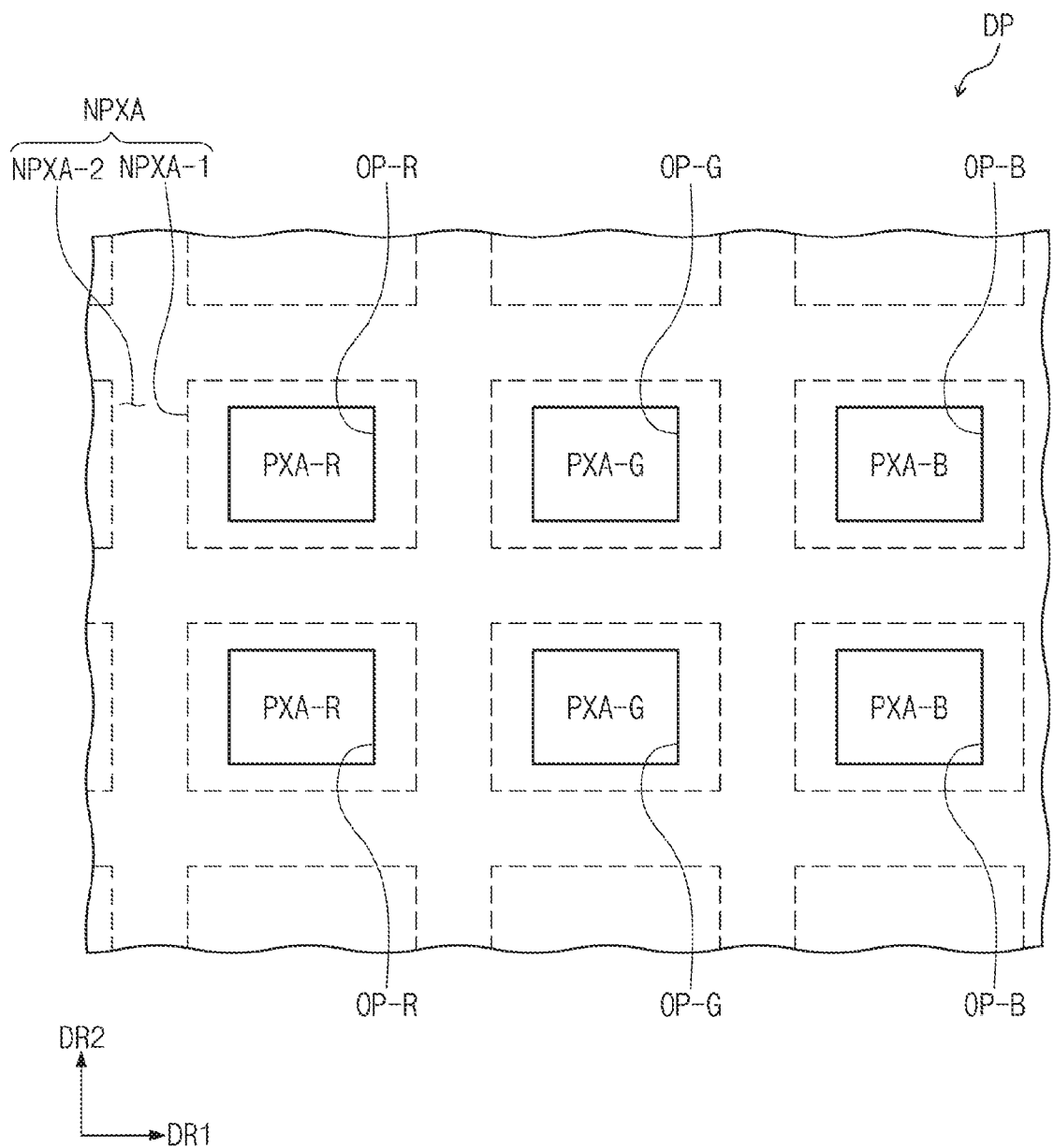
FIG. 4 is a partial plan view of an organic light emitting display panel according to an exemplary embodiment.
Figure 5A:
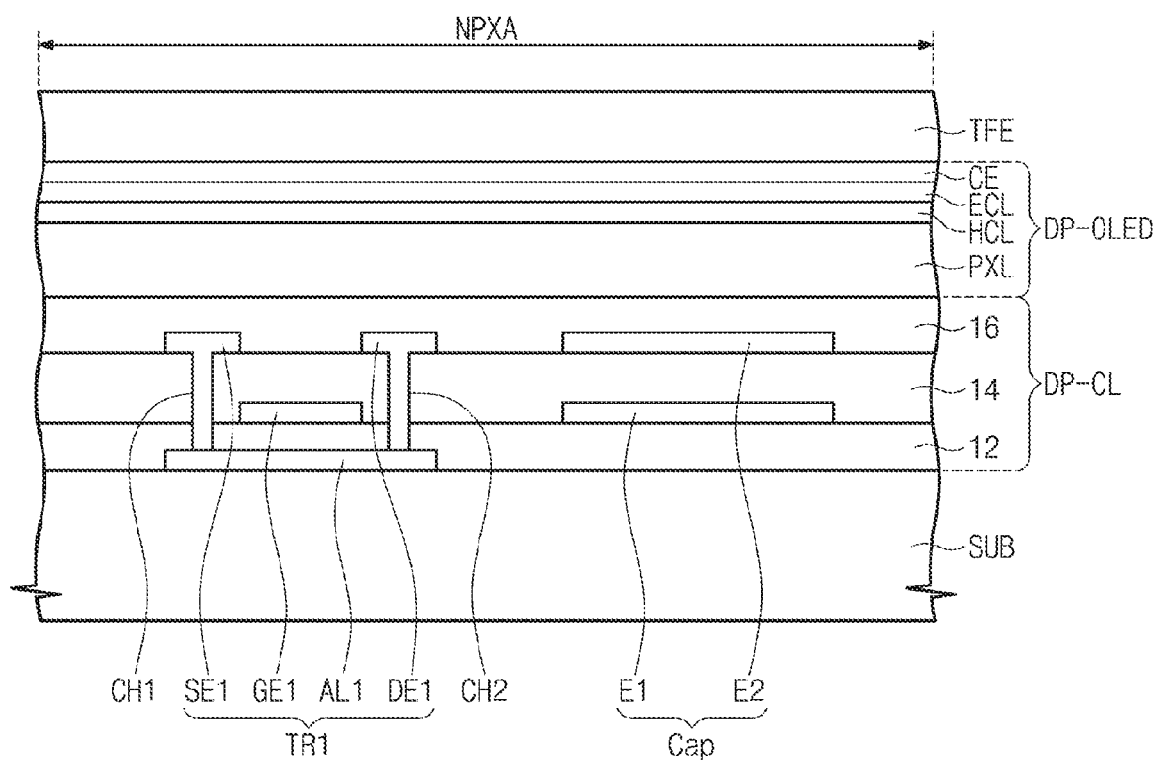
FIG. 5A and FIG. 5B are partial cross-sectional views of the organic light emitting display panel according to an exemplary embodiment.
Figure 5B:
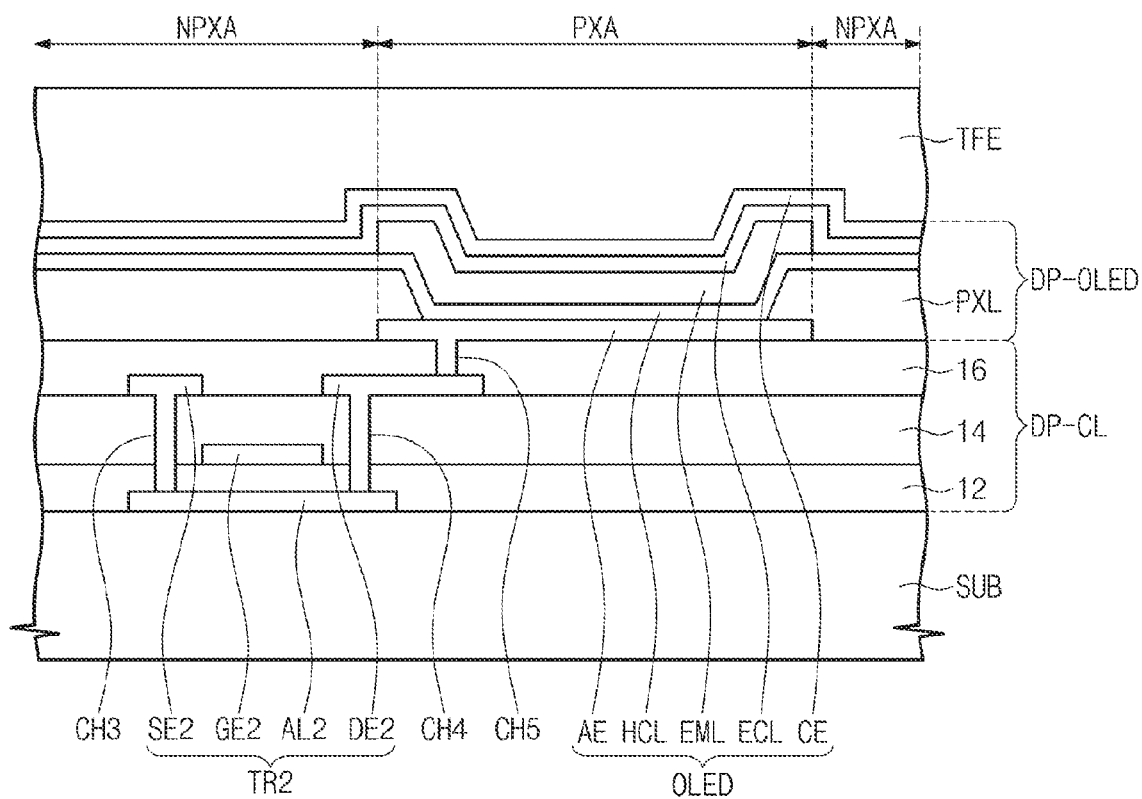

FIG. 4 is a partial plan view of the organic light emitting display panel DP according to an exemplary embodiment. FIGS. 5A and 5B are partial cross-sectional views of the organic light emitting display panel DP according to an exemplary embodiment. FIG. 4 illustrates a portion of the display area DA (see FIG. 3A). FIG. 5A is a partial cross-sectional view of a portion corresponding to the first transistor TR1 and the capacitor Cap of the equivalent circuit of FIG. 3B, and FIG. 5B is a partial cross-sectional view of a portion corresponding to the second transistor TR2 and the organic light emitting device OLED of the equivalent circuit of FIG. 3B.

As illustrated in FIG. 4, the organic light emitting display panel DP may be divided into a plurality of emission areas PXA-R, PXA-G, and PXA-B, and a non-emission area NPXA on a plane defined by the first directional axis DR1 and the second directional axis DR2. FIG. 4 illustrates three types of emission areas PXA-R, PXA-G, and PXA-B arranged in a matrix shape as an example. Organic light emitting devices that emit light having three different colors may be disposed on the three types of emission areas PXA-R, PXA-G, and PXA-B, respectively.

The three types of emission areas PXA-R, PXA-G, and PXA-B may emit light having colors different from each other, respectively. The non-emission area NPXA may be divided into first non-emission areas NPXA-1 surrounding the emission areas PXA-R, PXA-G, and PXA-B, and a second non-emission area NPXA-2 between adjacent first non-emission areas NPXA-1. A driving circuit of a sub pixel corresponding to each of the first non-emission areas NPXA-1, (e.g., the transistors TR1 and TR2 (see FIG. 3) or the capacitor Cap (see FIG. 3)) may be disposed on each of the first non-emission areas NPXA-1. The signal lines (e.g., the scan line SLi (see FIG. 3), the source line DLj (see FIG. 3), and the power line PL (see FIG. 3)) may be disposed on the second non-emission area NPXA-2. However, the inventive concept is not limited thereto. For example, the first non-emission areas NPXA-1 and the second non-emission area NPXA-2 may not be divided with respect to each other.

Although not separately shown, according to an exemplary embodiment, each of the emission areas PXA-R, PXA-G, and PXA-B may alternatively have a shape that is similar to a diamond shape. According to an exemplary embodiment, the organic light emitting devices that emit light having four different colors may be disposed on the four types of emission areas that are repeatedly disposed.

As used herein, "light having a predetermined color is emitted from the emission area" may refer to light generated in the light emitting device is emitted as it is, and/or light generated in the corresponding light emitting device is converted in color and then emitted.

As illustrated in FIGS. 5A and 5B, the organic light emitting display panel DP includes a base substrate SUB, a circuit layer DP-CL, an organic light emitting device layer DP-OLED, and a thin film encapsulation layer TFE. The circuit layer DP-CL may include a plurality of conductive layers and a plurality of insulation layers, and the organic light emitting device layer DP-OLED may include a plurality of conductive layers and a plurality of functional organic layers.

The base substrate SUB may include a plastic substrate, a glass substrate, and a metal substrate, which are formed of polyimide, as a flexible substrate. A semiconductor pattern AL1 (hereinafter, "a first semiconductor pattern") of the first transistor TR1 and a semiconductor pattern AL2 (hereinafter, "a second semiconductor pattern") of the second transistor TR2 are disposed on the base substrate SUB. The first and second semiconductor patterns AL1 and AL2 may include amorphous silicon that is formed at a low temperature. In addition, each of the first and second semiconductor patterns AL1 and AL2 may include a metal oxide semiconductor. Although not separately shown, the functional layers may further be disposed on one surface of the base substrate SUB. The functional layers may include at least one of a barrier layer and a buffer layer. The first and second semiconductor patterns AL1 and AL2 may be disposed on the barrier layer or the buffer layer.

The first insulation layer 12 covering the first and second semiconductor patterns AL1 and AL2 is disposed on the base substrate SUB. The first insulation layer 12 includes an organic layer and/or an inorganic layer. Particularly, the first insulation layer 12 may include a plurality of inorganic thin films. The plurality of inorganic thin films may include a silicon nitride layer and a silicon oxide layer.

A control electrode GE1 (hereinafter, "a first control electrode") of the first transistor TR1 and a control electrode GE2 (hereinafter, "a second control electrode") of the second transistor TR2 are disposed on the first insulation layer 12. A first electrode E1 of the capacitor Cap is disposed on the first insulation layer 12. The first control electrode GE1, the second control electrode GE2, and the first electrode E1 may be manufactured by the same photolithograph process as the scan line SLi (see FIG. 4). In particular, the first electrode E1 may include the same material as the scan line.

A second insulation layer 14 covering the first and second control electrodes GE1 and GE2 and the first electrode E1 are disposed on the first insulation layer 12. The second insulation layer 14 includes an organic layer and/or an inorganic layer. Particularly, the second insulation layer 14 may include a plurality of inorganic thin films. The plurality of inorganic thin films may include a silicon nitride layer and a silicon oxide layer.

The source line DLj (see FIG. 3B) and the power line PL (see FIG. 3B) may be disposed on the second insulation layer 14. An input electrode SE1 (hereinafter, "a first input electrode") and an output electrode DE1 (hereinafter, "a first output electrode") of the first transistor TR1 are disposed on the second insulation layer 14. An input electrode SE2 (hereinafter, "a second input electrode") and an output electrode DE2 (hereinafter, "a second output electrode") of the second transistor TR2 are disposed on the second insulation layer 14. The first input electrode SE1 is branched from the source line DLj, and the second input electrode SE2 is branched from the power line PL.

A second electrode E2 of the capacitor Cap is disposed on the second insulation layer 14. The second electrode E2 may be manufactured by the same photolithograph process as the source line DLj and the power line PL, and may include the same material as the source line DLj and the power line PL.

The first input electrode SE1 and the first output electrode DE1 are connected to the first semiconductor pattern AL1 through first and second through holes CH1 and CH2, which pass through the first and second insulation layers 12 and 14, respectively. The first output electrode DE1 may be electrically connected to the first electrode E1. For example, the first output electrode DE1 may be connected to the first electrode E1 through a through hole (not shown) passing through the second insulation layer 14. The second input electrode SE2 and the second output electrode DE2 are connected to the second semiconductor pattern AL2 through third and fourth through holes CH3 and CH4, which pass through the first and second insulation layers 12 and 14, respectively. According to an exemplary embodiment, each of the first and second transistors TR1 and TR2 may have a bottom gate structure.

A third insulation layer 16 covering the first input electrode SE1, the first output electrode DE1, the second input electrode SE2, and the second output electrode DE2 are disposed on the second insulation layer 14. The third insulation layer 16 includes an organic layer and/or an inorganic layer. Particularly, the third insulation layer 16 may include an organic material and provide a flat surface.

A pixel defining layer PXL and the organic light emitting device OLED are disposed on the third insulation layer 16. An opening OP is defined in the pixel defining layer PXL. The pixel defining layer PXL may be another insulation layer. The opening OP of FIG. 5 may correspond to openings OP-R, OP-G, and OP-B of FIG. 4.

The anode AE is connected to the second output electrode DE2 through a fifth through hole CH5 passing through the third insulation layer 16. The opening OP of the pixel defining layer PXL exposes at least a portion of the anode AE. A hole control layer HCL may be commonly defined in the emission areas PXA-R, PXA-G, PXA-B (see FIG. 4) and the non-emission area NPXA (see FIG. 4). An organic light emitting layer EML and an electronic control layer ECL are successively generated on the hole control layer HCL. Thereafter, the cathode CE may be commonly formed on the emission areas PXA-R, PXA-G, PXA-B and the non-light emitting area NPXA. The cathode CE may be formed by a deposition or sputtering process according to a layered structure thereof.

The thin film encapsulation layer TFE encapsulating the organic light emitting device layer DP-OLED is disposed on the cathode CE. The thin film encapsulation layer TFE may protect the organic light emitting device OLED against moisture and foreign substances.

Figure 6A:
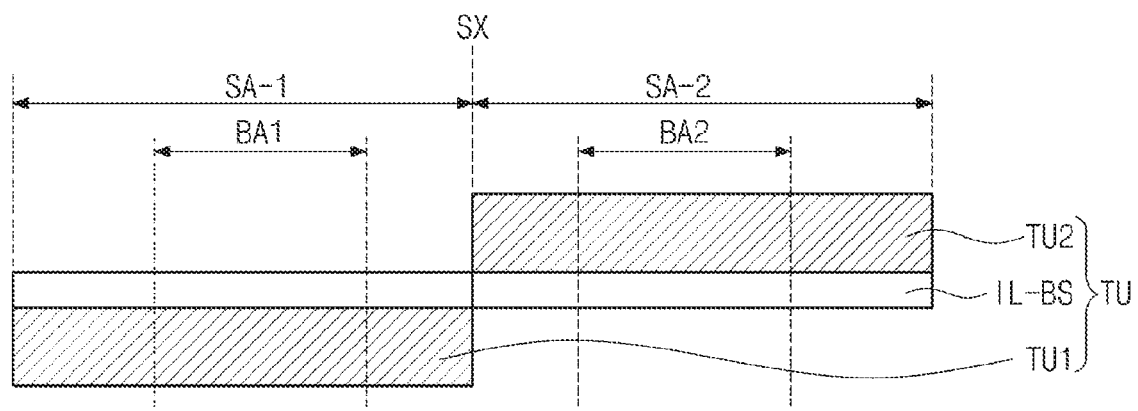
FIG. 6A is a cross-sectional view illustrating a structure of a touch sensing unit according to an exemplary embodiment.
Figure 6B:
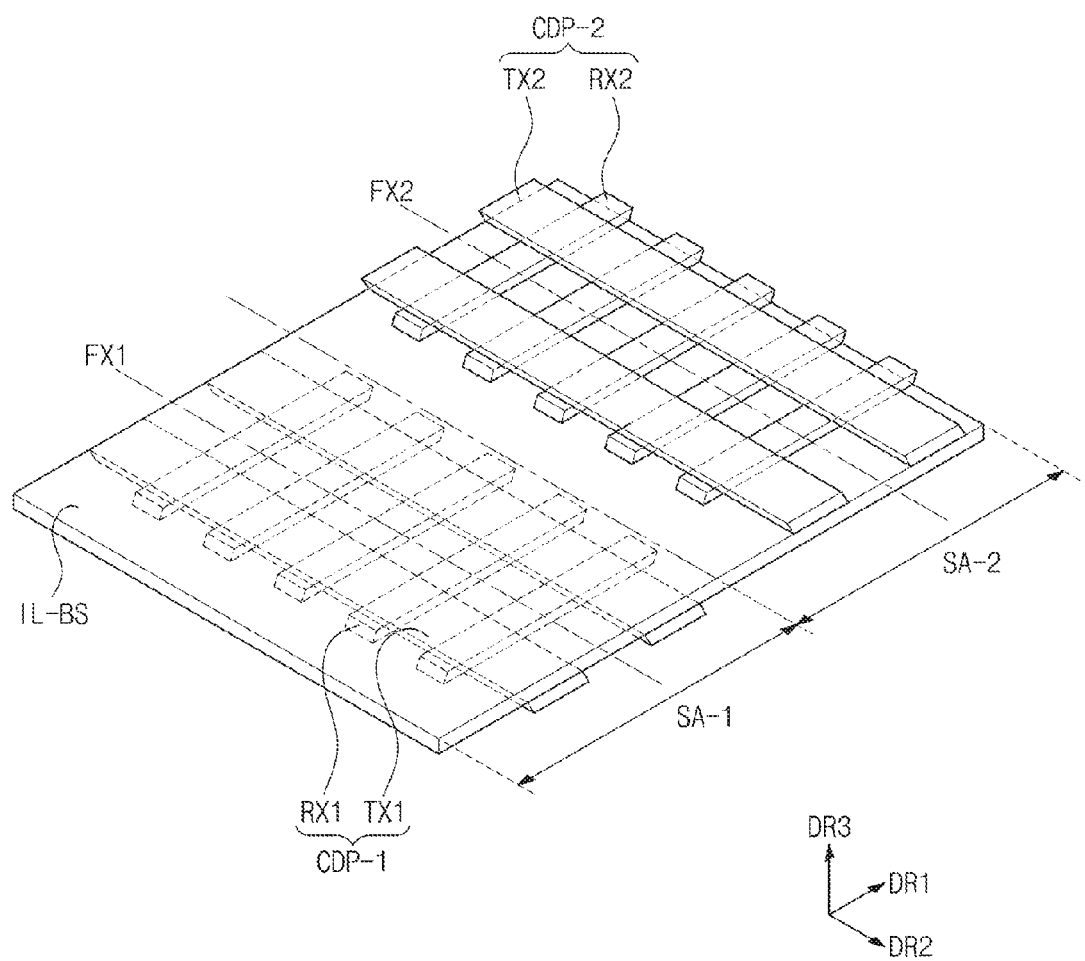
FIG. 6B is a perspective view illustrating the structure of the touch sensing unit according to an exemplary embodiment.
Figure 6C:
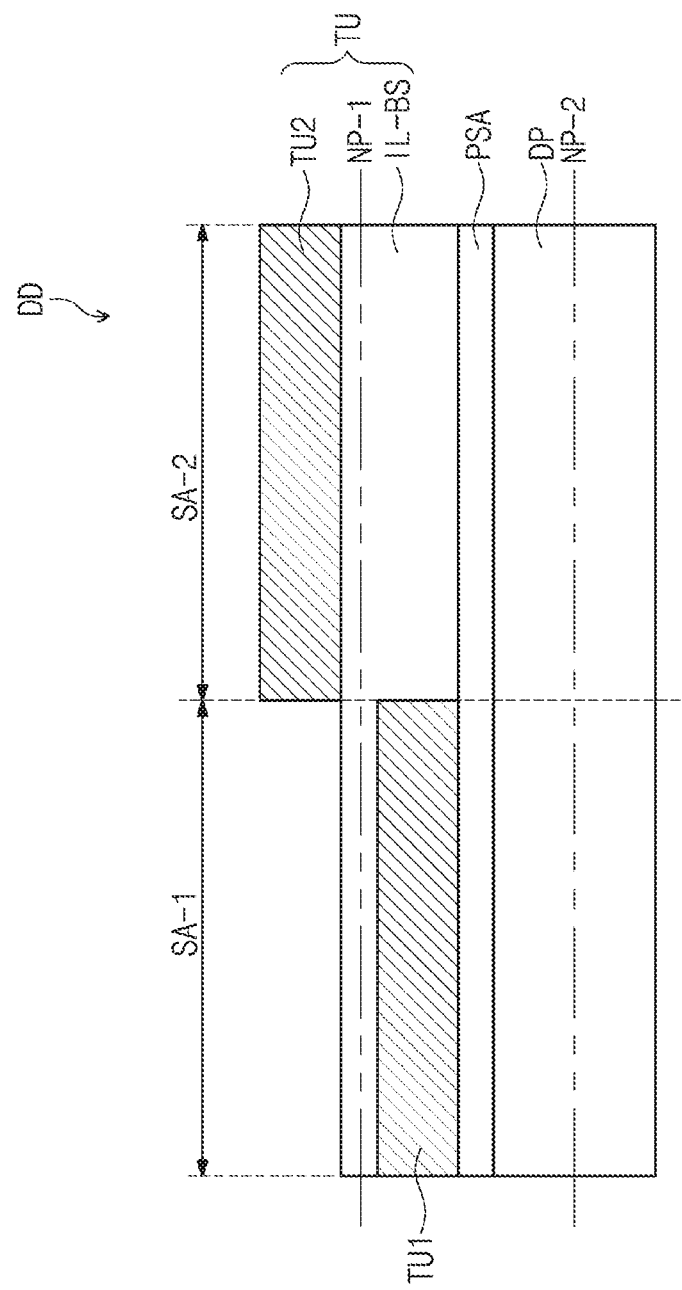
FIG. 6C is a cross-sectional view of the flexible display device according to an exemplary embodiment.

FIG. 6A is a cross-sectional view illustrating a structure of the touch sensing unit TU according to an exemplary embodiment. FIG. 6B is a perspective view illustrating the structure of the touch sensing unit TU according to an exemplary embodiment. FIG. 6C is a cross-sectional view of the flexible display device DD according to an exemplary embodiment.

Referring to FIG. 6A, the touch sensing unit TU may include a base insulation layer IL-BS, a first touch electrode part TU1 disposed on a bottom surface of the base insulation layer IL-BS for detecting an external input, and a second touch electrode part TU2 disposed on a top surface of the base insulation layer IL-BS for detecting an external input.

The base insulation layer IL-BS may provide a base surface to the first and second touch electrode parts TU1 and TU2. The base insulation layer IL-BS may include an inorganic or organic material. The inorganic material may include silicon oxide or silicon nitride. The organic material may include at least one of an acrylic-based resin, a methacrylic-based resin, a polyisoprene-based resin, a vinyl-based resin, an epoxy-based resin, a urethane-based resin, a cellulose-based resin, and a perylene-based resin.

The first touch electrode part TU1 may overlap the first bending area BA1 on one surface of the base insulation layer IL-BS. For example, as illustrated in FIG. 6A, the first touch electrode part TU1 may have the same area as that of the first area SA-1 one surface of the base insulation layer IL-BS.

The second touch electrode part TU2 may overlap the second bending area BA2 on the other surface of the base insulation layer IL-BS. For example, as illustrated in FIG. 6A, the second touch electrode part TU2 may have the same area as that of the second area SA-2 of the other surface of the base insulation layer IL-BS.

Each of the touch electrode parts TU1 and TU2 may have a single-layer structure or a multi-layer structure, in which a plurality of layers are laminated in the third directional axis DR3. The touch electrode part having the multi-layered structure may include a transparent conductive layer and at least one metal layer. The transparent conductive layer may include indium tin oxide (ITO), indium zinc oxide (IZO), zinc oxide (ZnO), or indium tin zinc oxide (ITZO), PEDOT, a metal nano wire, and graphene. The metal layer may include molybdenum, silver, titanium, copper, aluminum, and an alloy thereof.

Each of the first and second touch electrode parts TU1 and TU2 according to an exemplary embodiment may include conductive patterns. For example, as illustrated in FIG. 6B, the first touch electrode part TU1 may include first conductive patterns CDP-1, and the second touch electrode part TU2 may include second conductive patterns CDP-2. The first conductive patterns CDP-1 may not overlap the second area SA-2, and the second conductive patterns CDP-2 may not overlap the first area SA-1.

Each of the first and second conductive patterns CDP-1 and CDP-2 according to an exemplary embodiment may have a two-layer structure or a one-layer structure. For example, in FIG. 6B, each of the conductive patterns CDP-1 and CDP-2 includes the touch electrodes. More particularly, the first conductive patterns CDP-1 may include touch electrodes RX1 extending in the first direction DR1 and arranged in the second direction DR2, and touch electrodes TX1 extending in the second direction DR2 and arranged in the first direction DR1. The second conductive patterns CDP-2 may include touch electrodes RX2 extending in the first direction DR1 and arranged in the second direction DR2, and touch electrodes TX2 extending in the second direction DR2 and arranged in the first direction DR1. Each of the touch electrodes of the first and second conductive patterns CDP-1 and CDP-2 may have, for example, a simple bar shape.

When each of the first and second conductive patterns CDP-1 and CDP-2 has the two-layer structure, the touch sensing unit TU may be a capacitive touch sensing unit that may obtain coordinate information at a touched point in a self-capacitance manner or a mutual capacitance manner. However, the inventive concept is not limited to the driving manner of the touch sensing unit for obtaining the coordinate information.

Referring to FIG. 6C, the touch sensing unit TU according to an exemplary embodiment may be disposed on the display panel DP. For example, an encapsulation layer (not shown) of the display panel DP may provide the base surface to the touch sensing unit TU, and an adhesion layer PSA, which may adhere the touch sensing unit TU to the display panel DP, may be disposed on the encapsulation layer. The adhesion layer PSA may be an interlayer disposed between the touch sensing unit TU and the display panel DP and prevent a touch input signal of the touch sensing unit TU from interfering with an image signal of the display panel DP.

In the flexible display device DD according to an exemplary embodiment, when the flexible display device DD is bent, force applied to each of the touch sensing unit TU and the display panel DP may be varied according to a modulus size of the adhesion layer PSA. For example, a modulus of the adhesion layer PSA according to an exemplary embodiment may be less than that of each of the touch sensing unit TU and the display panel DP by a predetermined degree. In this case, when the flexible display device DD is bent, decoupling effect may occur, in which each of the touch sensing unit TU and the display panel DP independently moves with respect to the adhesion layer PSA.

More particularly, referring to FIG. 6C, independent neutral surfaces NP1 and NP2 may be disposed on each of the touch sensing unit TU and the display panel DP. Here, when the flexible display device DD according to an exemplary embodiment is bent, the touch sensing unit TU may be applied with tension force and compression force with respect to the first neutral surface NP1, and the display panel DP may be applied with tension force and compression force with respect to the second neutral surface NP2.

In the touch sensing unit TU of the flexible display device DD according to an exemplary embodiment, the first neutral surface NP1 may be disposed on the base insulation layer IL-BS of the touch sensing unit TU. The touch sensing unit UT according to an exemplary embodiment may be bent so that the first conductive patterns CDP-1 is positioned inside the first folding axis FX1, and the second conductive patterns CDP-2 is positioned inside the second folding axis FX2 (see, for example, FIGS. 2B and 6B). More particularly, the first and second conductive patterns CDP-1 and CDP-2 may be disposed at positions where the flexible display device DD is applied with the compression force with respect to the first neutral surface NP1, when the flexible display device DD is bent.

As described above, although the flexible display device DD according to an exemplary embodiment may be bent in an S shape, since the conductive patterns CDP-1 and CDP-2 of the touch sensing unit TU are disposed at positions to which the compression force is applied, deterioration of touch sensitivity from generation of cracks in a sensor conductive film may be reduced.

Hereinafter, a structure of the conductive patterns according to an exemplary embodiment will be described with references to the first touch electrode part TU1.

Figure 7A:
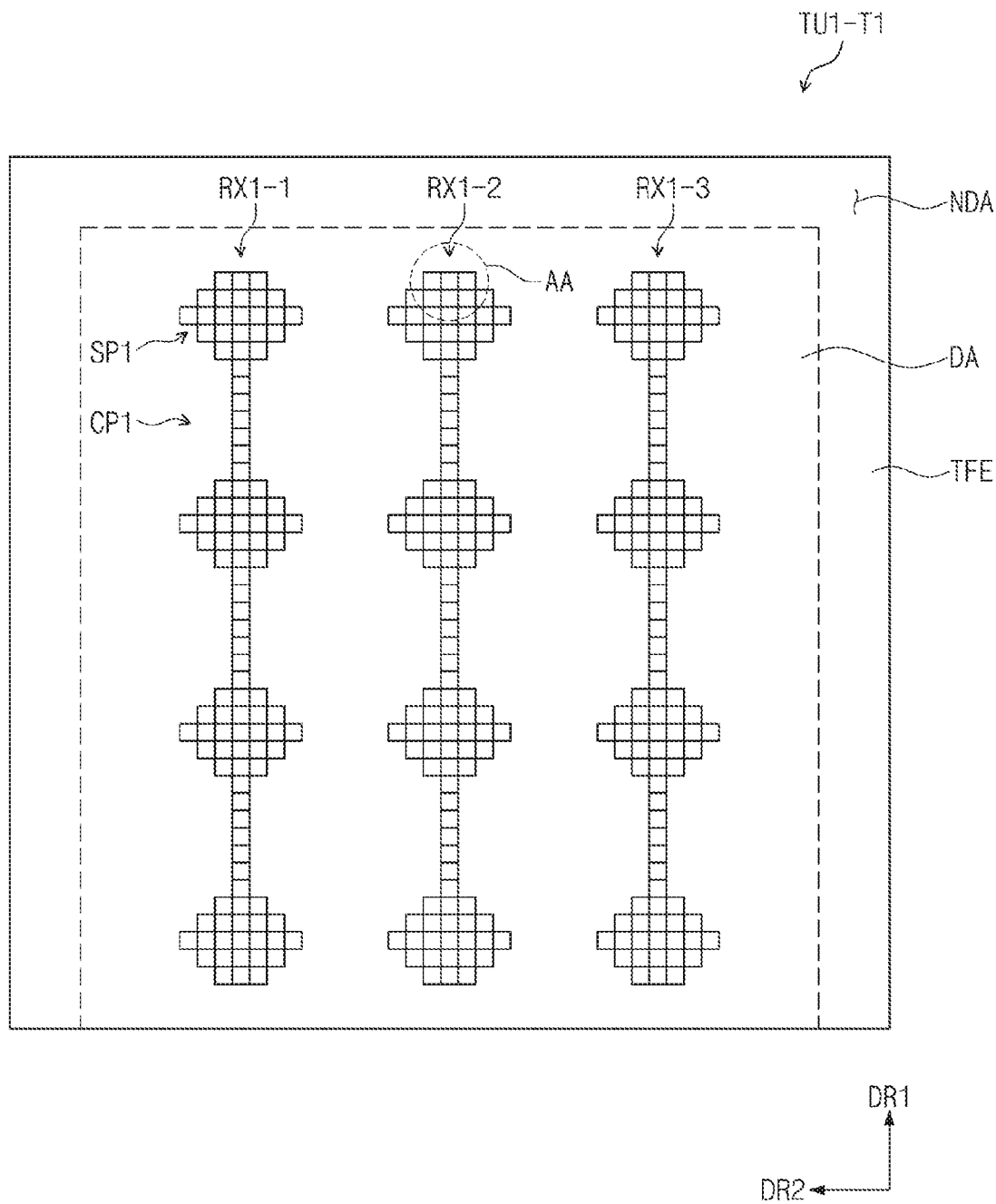
FIG. 7A and FIG. 7B are plan views illustrating conductive patterns of a first touch electrode part according to an exemplary embodiment.
Figure 7B:
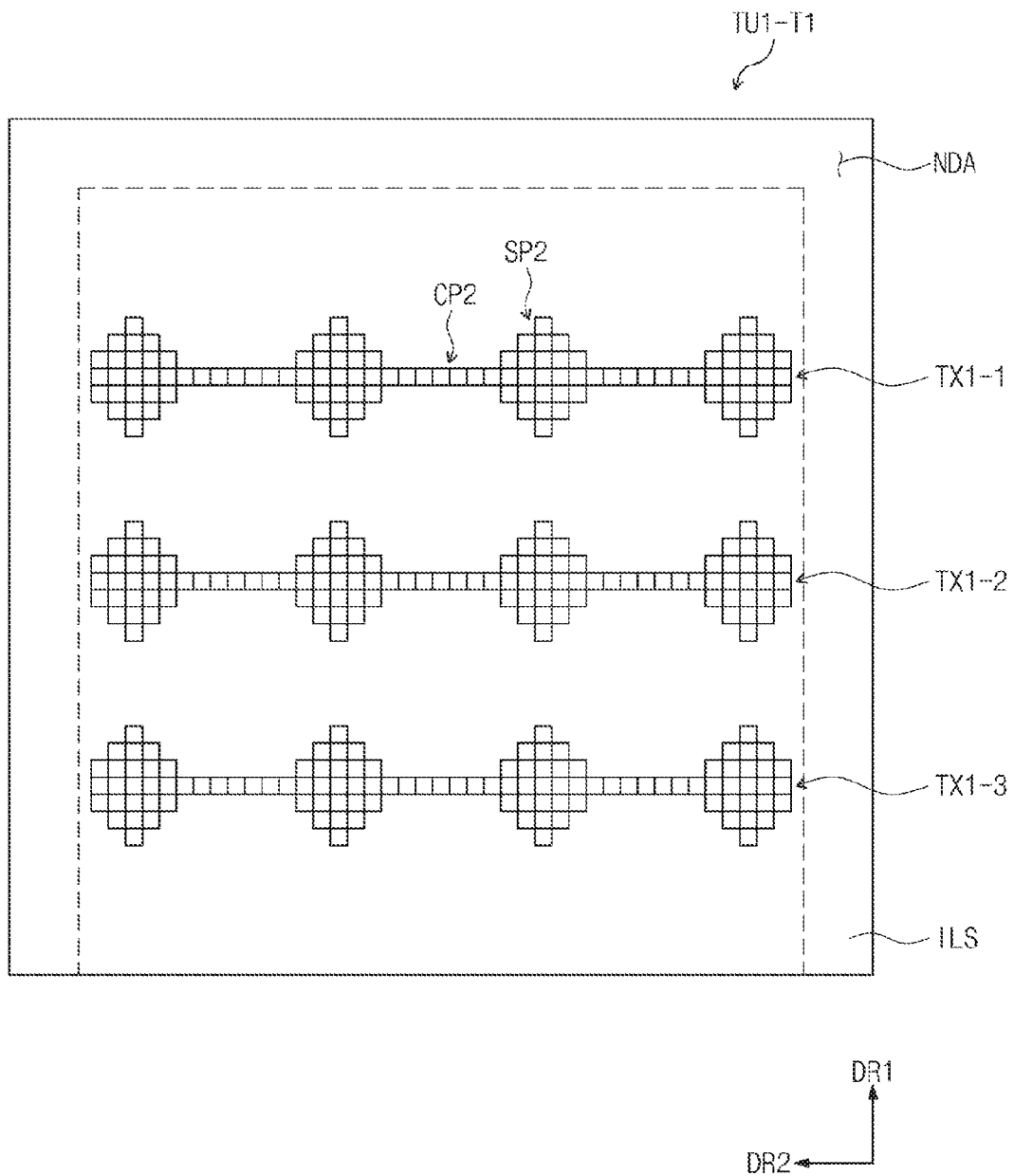

FIGS. 7A and 7B are plan views illustrating conductive patterns of a first touch electrode part TU1-T1 according to an exemplary embodiment.

Referring to FIG. 7A, the first touch electrode part TU1-T1 may include first touch electrodes RX1-1, RX1-2, and RX1-3 extending in the first direction DR1 and arranged in the second direction DR2. In FIG. 7A, three first touch electrodes RX1-1, RX1-2, and RX1-3 are illustrated as an example.

Each of the first touch electrodes RX1-1, RX1-2, and RX1-3 may include first sensor parts SP1 and first connection parts CP1. The first sensor parts SP1 may be arranged in the first direction DR1. Each of the first connection parts CP1 may connect adjacent first sensor parts SP1 to each other. The first touch electrodes RX1-1, RX1-2, and RX1-3 may be disposed on the encapsulation layer TFE (see FIGS. 5A and 5B) of the display panel DP.

Referring the FIG. 7B, the first touch electrode part TU1-T1 may further include second touch electrodes TX1-1, TX1-2, and TX1-3 extending in the second direction DR2 and arranged in the first direction DR1. The second touch electrodes TX1-1, TX1-2, and TX1-3 may be disposed on a layer different from that on which the first touch electrodes RX1-1, RX1-2, and RX1-3 are disposed. For example, the second touch electrodes TX1-1, TX1-2, and TX1-3 may be disposed on a sub insulation layer ILS covering the first touch electrodes RX1-1, RX1-2, and RX1-3. As used herein, "covering" may refer to the sub-insulation layer ILS entirely overlapping the first touch electrodes RX1-1, RX1-2, and RX1-3 and protecting the first touch electrodes RX1-1, RX1-2, and RX1-3 from external moisture or foreign substances. The second touch electrodes TX1-1, TX1-2, and TX1-3 may be insulated from the first touch electrodes RX1-1, RX1-2, and RX1-3 by the sub-insulation layer ILS.

The sub-insulation layer ILS may include an inorganic or organic material. The inorganic material may include silicon oxide or silicon nitride. The organic material may include at least one of an acrylic-based resin, a methacrylic-based resin, a polyisoprene-based resin, a vinyl-based resin, an epoxy-based resin, a urethane-based resin, a cellulose-based resin, and a perylene-based resin.

In FIG. 7B, three second touch electrodes TX1-1, TX1-2, and TX1-3 are illustrated as an example. Each of the second touch electrodes TX1-1, TX1-2, and TX1-3 may include second sensor parts SP2 and second connection parts CP2. The second sensor parts SP2 may be arranged in the second direction DR2. Each of the second connection parts CP2 may connect two adjacent second sensor parts SP2 to each other.

The first touch electrodes RX1-1, RX1-2, and RX1-3 may be capacitively coupled to the second touch electrodes TX1-1, TX1-2, and TX1-3. Since touch detection signals are applied to the first touch electrodes RX1-1, RX1-2, and RX1-3, capacitors may be disposed between the first sensor parts SP1 and the second sensor parts SP2.

The shapes of the first touch electrodes RX1-1, RX1-2, and RX1-3 and the second touch electrodes TX1-1, TX1-2, and TX1-3 including the sensor parts and the connection parts may be variously modified. For example, as illustrated in FIGS. 7A and 7B, each of the first touch electrodes RX1-1, RX1-2, and RX1-3 the second touch electrodes TX1-1, TX1-2, and TX1-3 may have a mesh shape in which a plurality of openings are defined. Also, each of the first touch electrodes RX1-1, RX1-2, and RX1-3 and the second touch electrodes TX1-1, TX1-2, and TX1-3 may have a bar shape having a predetermined width.

Figure 8A:
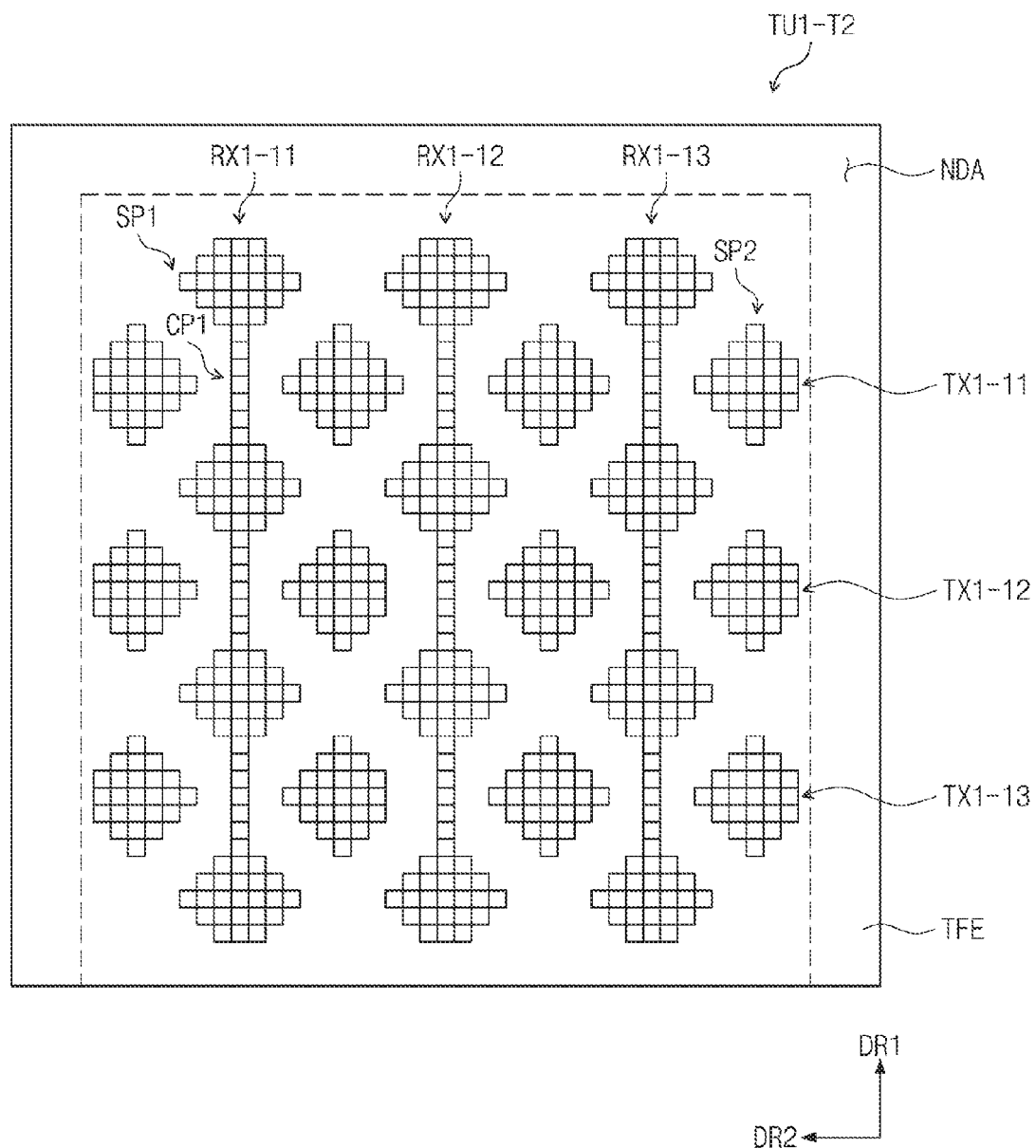
FIG. 8A and FIG. 8B are plan views illustrating conductive patterns of the first touch electrode part according to an exemplary embodiment.
Figure 8B:
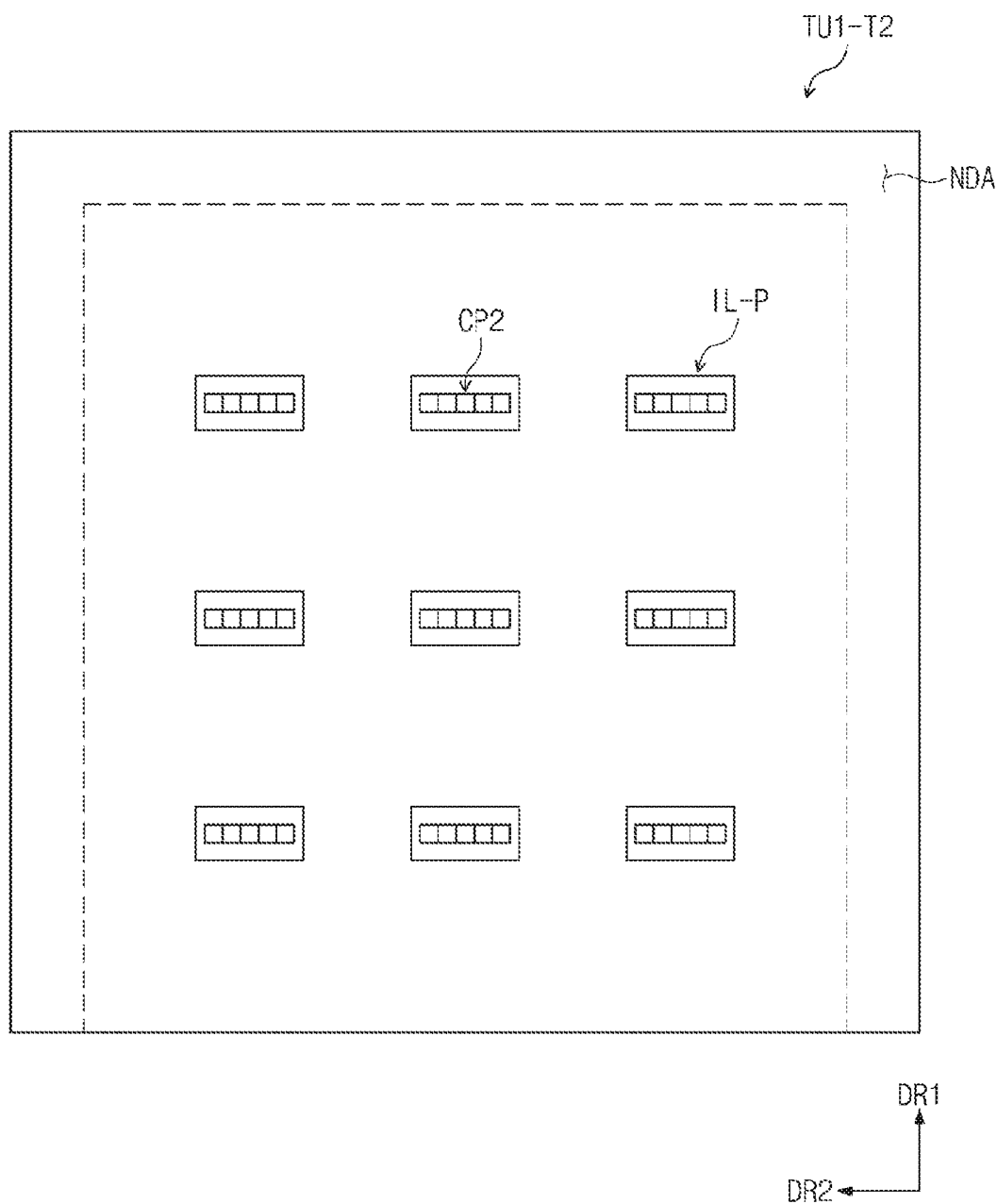

FIGS. 8A and 8B are plan views illustrating conductive patterns of a first touch electrode part TU1-T2 according to an exemplary embodiment.

In FIGS. 8A and 8B, the first conductive patterns CDP-1 is illustrated as having a one-layer structure. The first conductive patterns CDP-1 may be driven in a self-capacitance manner. However, the inventive concept is not limited to the driving manner for obtaining coordinate information.

Referring to FIG. 8A, the first conductive patterns CDP-1 of the first touch electrode part TU1-T2 may include first touch electrodes RX1-11, RX1-12, and RX1-13 and second touch electrodes TX1-11, TX1-12, and TX1-13. The first touch electrodes RX1-11, RX1-12, and RX1-13 and the second touch electrodes TX1-11, TX1-12, and TX1-13 may be disposed on the thin film encapsulation layer TFE. Each of the first touch electrodes RX1-11, RX1-12, and RX1-13 includes a plurality of first sensor parts SP1 and a plurality of connection parts CP1.

Referring to FIG. 8B, the second sensor parts SP2 of the second touch electrodes TX1-11, TX1-12, and TX1-13 may be connected to each other by the plurality of second connection parts CP2. Insulation patterns IL-P insulating the first connection parts CP1 from the second connection parts CP2 may be disposed on the thin film encapsulation layer TFE. A separate insulation layer for insulating the first connection parts CP1 from the second connection parts CP2 may be disposed to entirely overlap the first touch electrodes RX1-11, RX1-12, and RX1-13 and the second sensor parts SP2. Each of the second connection parts CP2 may function as a bridge.

Figure 9:
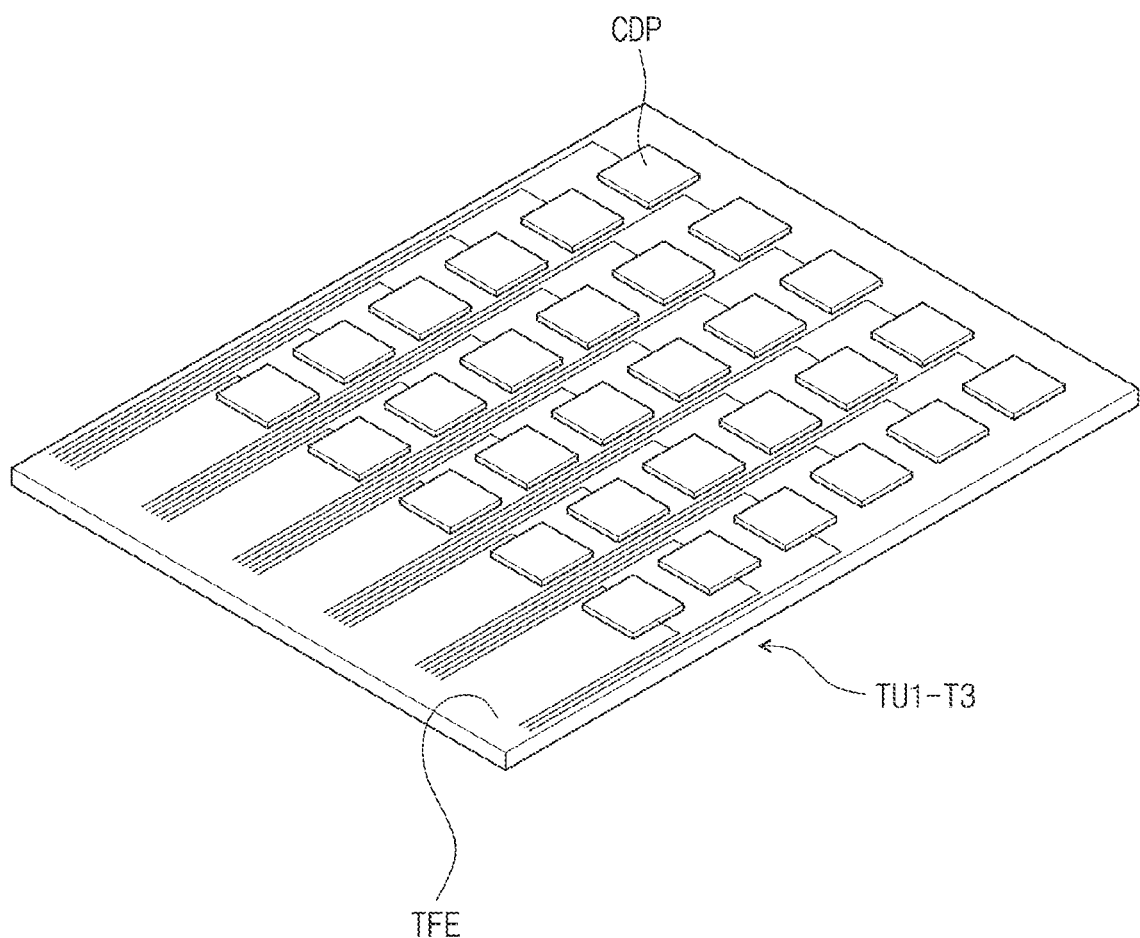
FIG. 9 is a plan view of first conductive patterns according to an exemplary embodiment.

FIG. 9 is a plan view of first conductive patterns CDP-1 according to an exemplary embodiment.

Each of the first and second conductive patterns CDP-1 and CDP-2 according to an exemplary embodiment may have a one-layer structure. For example, as illustrated in FIG. 9, a first touch electrode part TU1-T3 may include a plurality of electrodes CDP disposed in the form of a matrix on a plane defined by the first and second directions DR1 and DR2. The electrodes CDP of the first touch electrode part TU1-T3 may be respectively connected to signal lines for transmitting touch input signals obtained by the electrodes CDP. Although FIG. 9 only illustrates the first touch electrode part TU1-T3, the second touch electrode part TU2 may also include a plurality of electrodes arranged in a matrix form on a plane defined by the first and second directions DR1 and DR2, similarly to the first touch electrode part TU1-T3. The electrodes CDP may obtain coordinate information of a touched point in a self-capacitance manner.

Figure 10A:
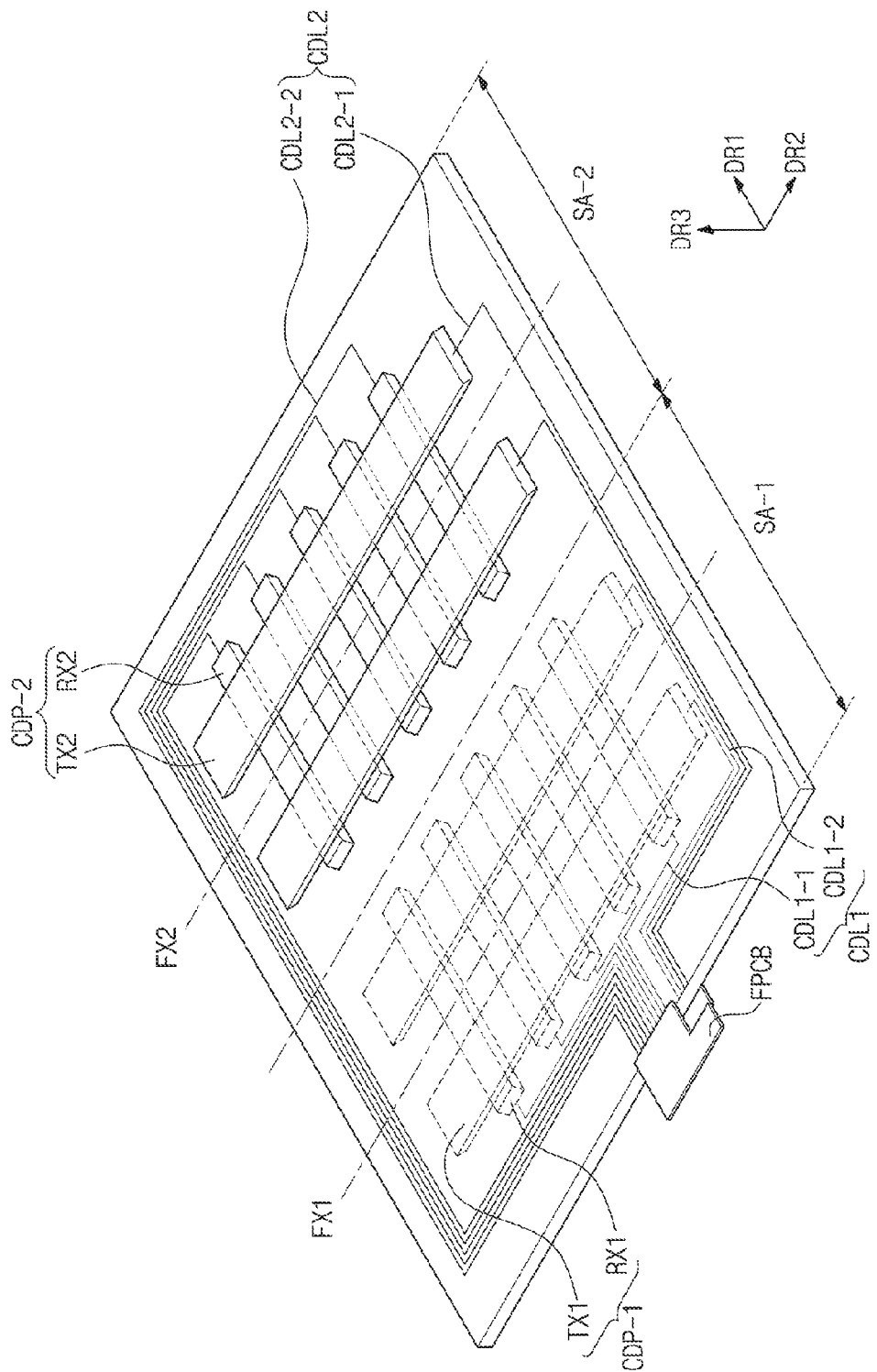
FIG. 10A and FIG. 10B are plan views of signal lines respectively connected to first and second conductive patterns and a circuit board connecting the signal lines to each other.
Figure 10B:
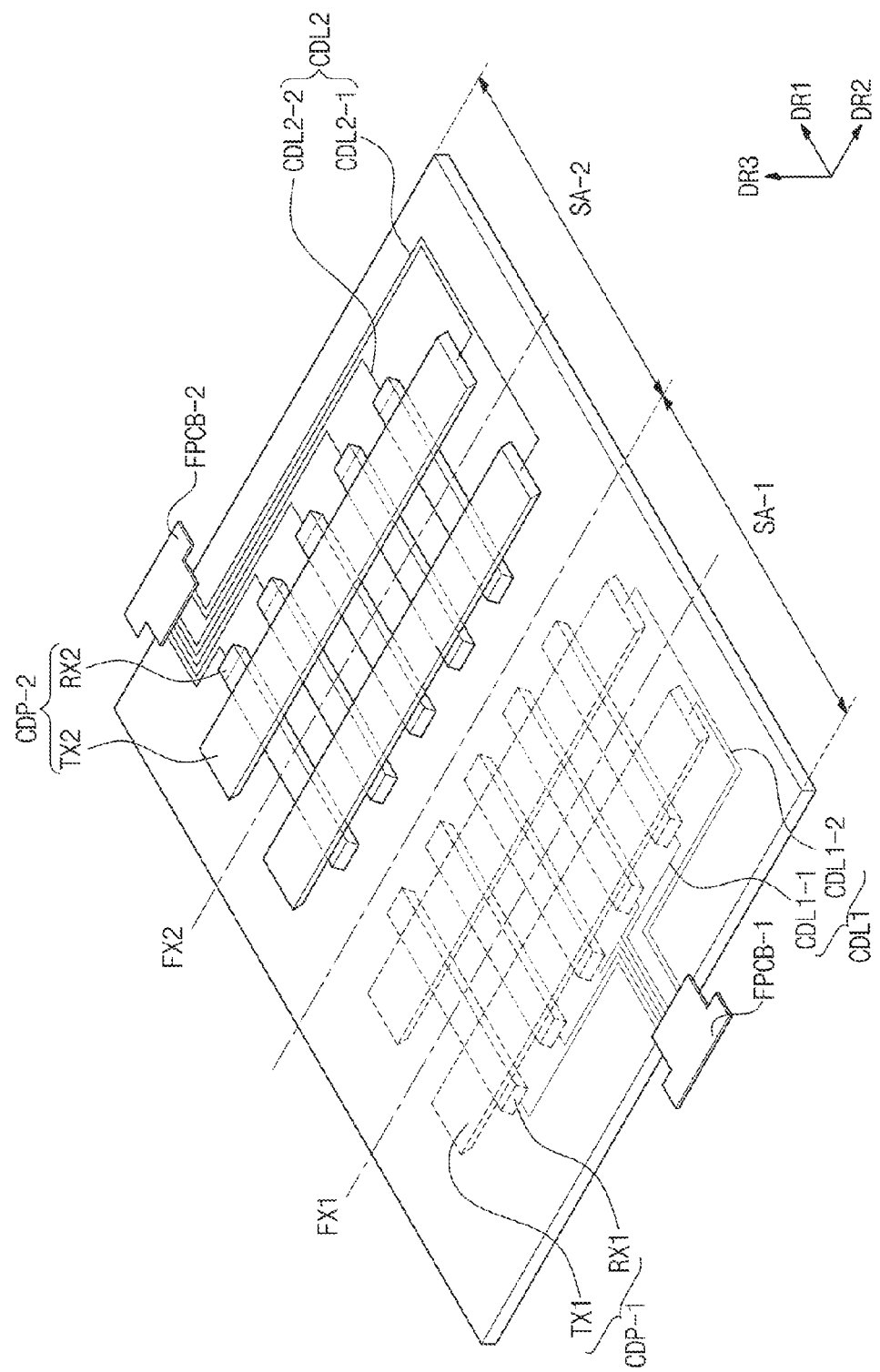

FIGS. 10A and 10B are perspective views of signal lines respectively connected to the first and second conductive patterns CDP-1 and CDP-2 and a circuit board FPCB connecting the signal lines to each other.

The touch sensing unit TU according to an exemplary embodiment may further include a circuit board FPCB, first signal lines CDL1 connected to the first conductive patterns CDP-1, and second signal lines CDL2 connected to the second conductive patterns CDP-2.

The circuit board FPCB may be disposed on a base insulation layer IL-BS and connected to the first and second signal lines CDL1 and CDL2. The circuit board FPCB may be a flexible printed circuit board using a flexible insulation board.

The first signal lines CDL1 may include first sub signal lines CDL1-1 respectively connected to the first touch electrodes RX1, and second sub signal lines CDL1-2 respectively connected to the second touch electrodes TX1. The first signal lines CDL1 may be respectively connected to the first and second touch electrodes RX1 and TX1 to transmit touch input signals obtained by the first and second touch electrodes RX1 and TX1.

The second signal lines CDL2 may include third sub-signal lines CDL2-1 respectively connected to the third touch electrodes RX2, and fourth sub-signal lines CDL2-2 respectively connected to the fourth touch electrodes TX2. The second signal lines CDL2 may be respectively connected to the third and fourth touch electrodes RX2 and TX3 to transmit touch input signals obtained by the third and fourth touch electrodes RX2 and TX3.

The first and second signal lines CDL1 and CLD2 may be connected to one circuit board FPCB. For example, the circuit board FPCB may be disposed on one side of the base insulation layer IL-BS, and the first and second signal lines CDL1 and CDL2 may be connected to the circuit board FPCB at one side of the base insulation layer IL-BS. The circuit board FPCB according to an exemplary may have an integrated structure, of which a portion connected to the first signal lines CDL1 on a top surface of the base insulation layer IL-BS and a portion connected to the second signal lines CDL2 on a bottom surface of the base insulation layer IL-BS are integrated with each other, as illustrated in FIG. 10A.

For example, as illustrated in FIG. 10A, when the circuit board FPCB is attached to an edge portion of the first area SA-1 of the base insulation layer, the first and second signal lines CDL1 and CDL2 may be connected to the circuit board FPCB on the first area SA-1. In this case, the first signal lines CDL1 may overlap the first area SA1 only, and the second signal lines CDL2 may overlap the first and second areas SA1 and SA2.

As another example, the first and second signal lines CDL1 and CLD2 may be respectively connected to the circuit boards FPCB spaced apart from each other. In particular, referring to FIG. 10B, the circuit board FPCB may include a first circuit board FPCB-1 attached on one side of the base insulation layer IL-BS and a second circuit board FPCB-2 attached to the other side facing the one side of the base insulation layer IL-BS. More particularly, the first signal lines CDL1 may be connected to the first circuit board FPCB-1 attached to an edge portion of the first area SA-1. The second signal lines CDL2 may be connected to the second circuit board FPCB-2 attached to an edge portion of the second area SA-2. In this case, the first signal lines CDL1 may overlap the first area SA1 and do not overlap the second area SA2, and the second signal lines CDL2 may not overlap the first area SA1 and overlap the second area SA2.

As described above, in the flexible display device DD according to an exemplary embodiment, the first and second signal lines CDL1 and CDL2 may be selectively connected to the same circuit board or the different circuit boards according to the size of the display panel.

The touch sensing unit TU according to an exemplary embodiment may further include electrode patterns for preventing the first and second conductive patterns CDP-1 and CDP-2 from being seen from the outside.

Figure 11A:
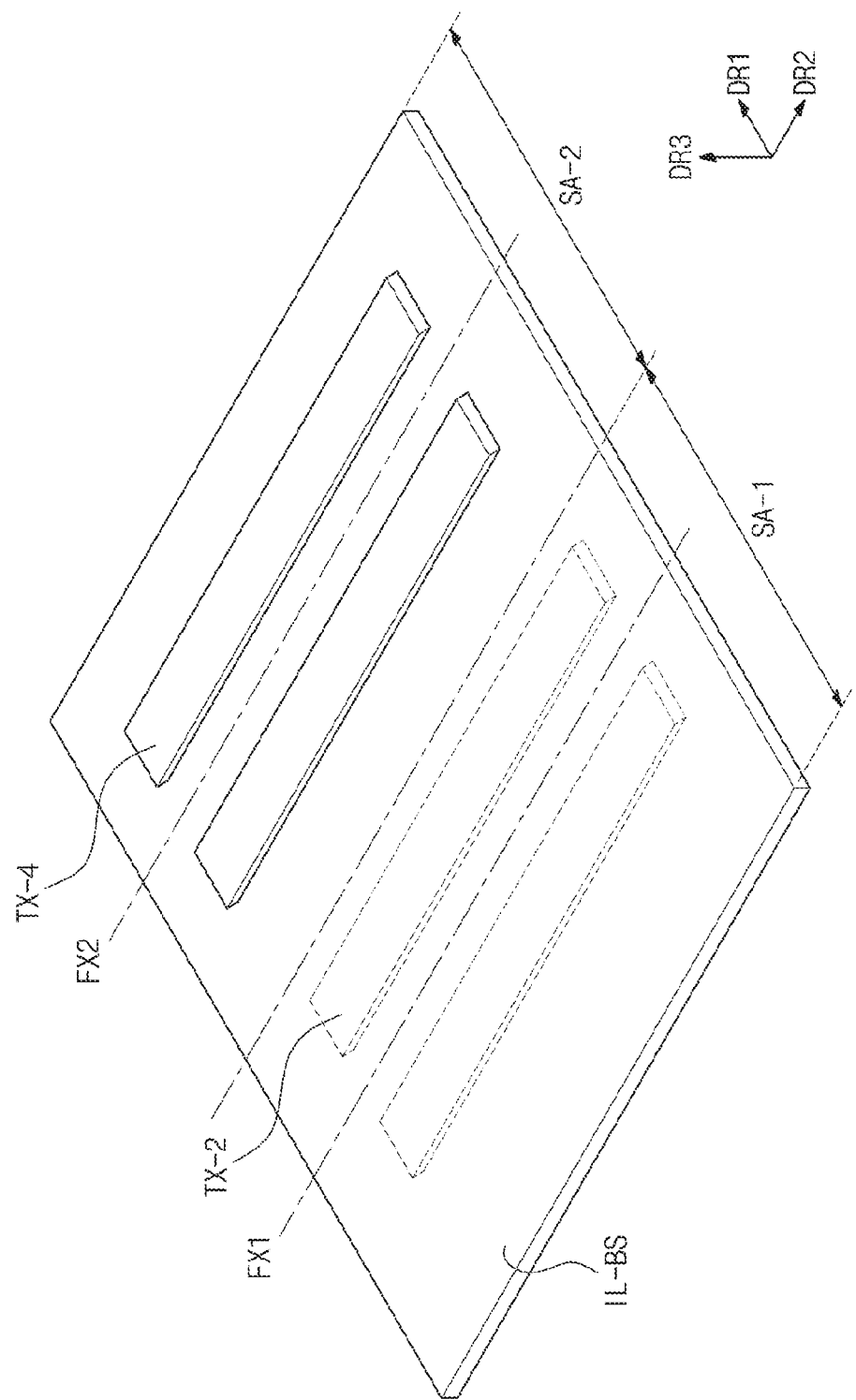
FIG. 11A is a perspective view of second touch electrodes and fourth touch electrodes according to an exemplary embodiment.
Figure 11B:
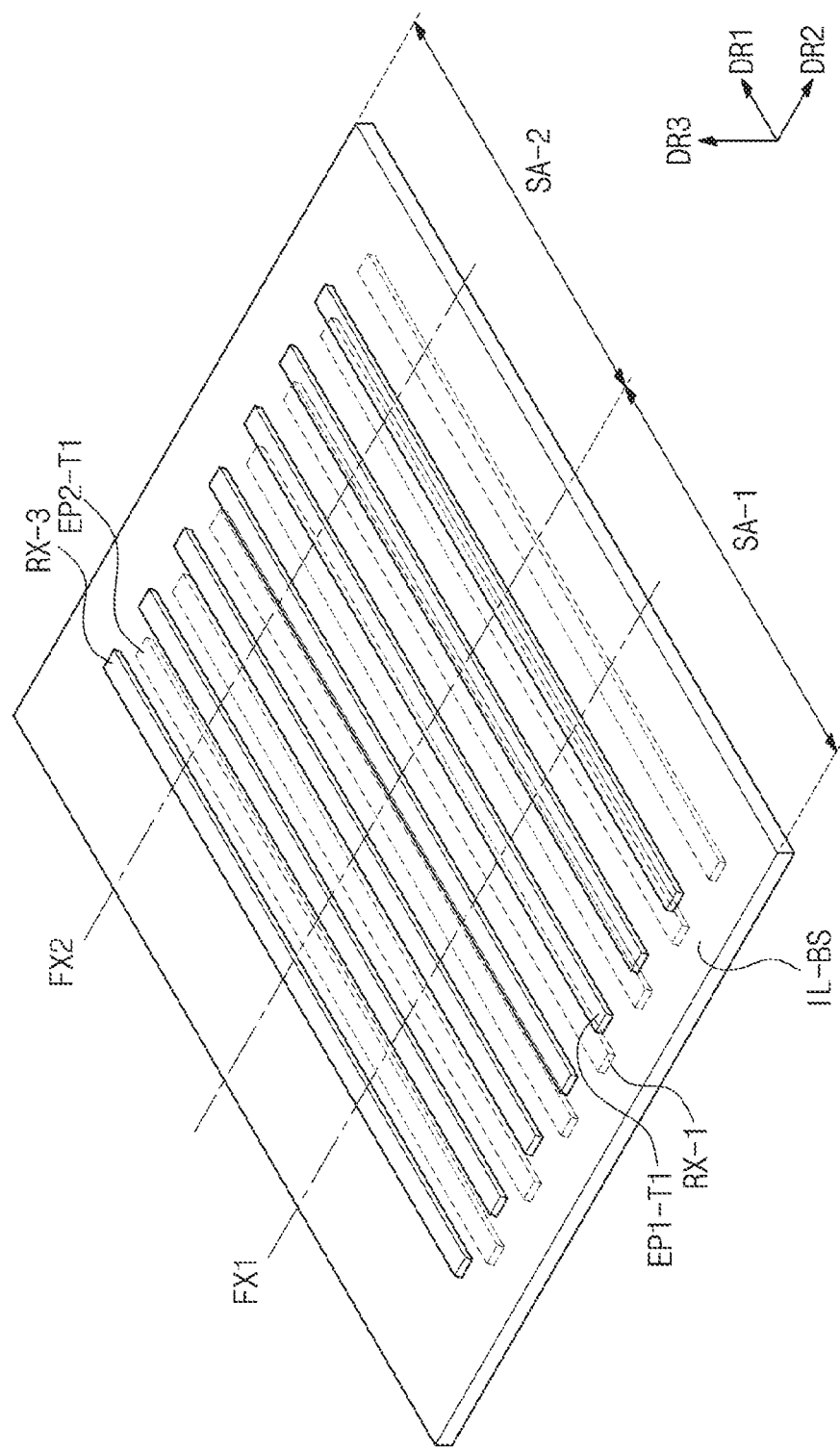
FIG. 11B is a perspective view of the first and second electrode patterns respectively connected to first and third touch electrodes according to an embodiment of the inventive concept.
Figure 12A:
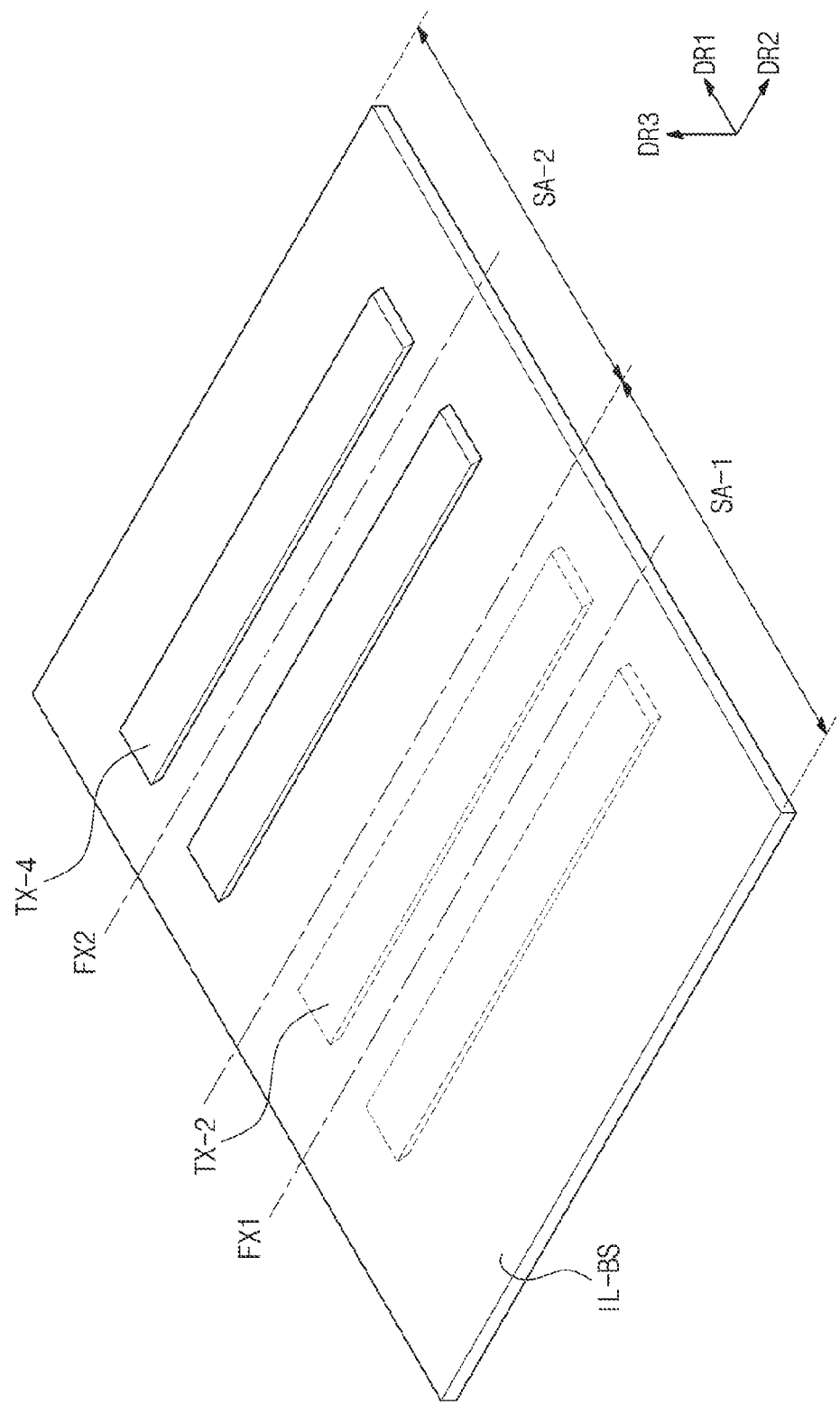
FIG. 12A is a perspective view of the second touch electrodes and the fourth touch electrodes according to an exemplary embodiment.

FIG. 11A is a perspective view of second touch electrodes TX-2 and fourth touch electrodes TX-4 according to an exemplary embodiment, and FIG. 11B is a perspective view of the first and second electrode patterns EP1-T1 and EP2-T1 respectively connected to first and third touch electrodes RX-1 and RX-3 according to an exemplary embodiment. FIG. 12A is a perspective view of the second touch electrodes TX-2 and the fourth touch electrodes TX-4 according to an exemplary embodiment, and FIG. 12B is a perspective view of the first and second electrode patterns EP1-T2 and EP2-T2 respectively spaced apart from the first and third touch electrodes RX-1 and RX-3 according to an exemplary embodiment.

Each of the first and second conductive patterns CDP-1 and CDP-2 may have the same structure as that described with reference to FIGS. 7A to 9. Each of the touch electrodes of the first and second conductive patterns CDP-1 and CDP-2 are illustrated as having a simple bar shape. Further, an insulation layer disposed between the touch electrodes for insulating the touch electrodes will be omitted for convenience of description.

Figure 12B:
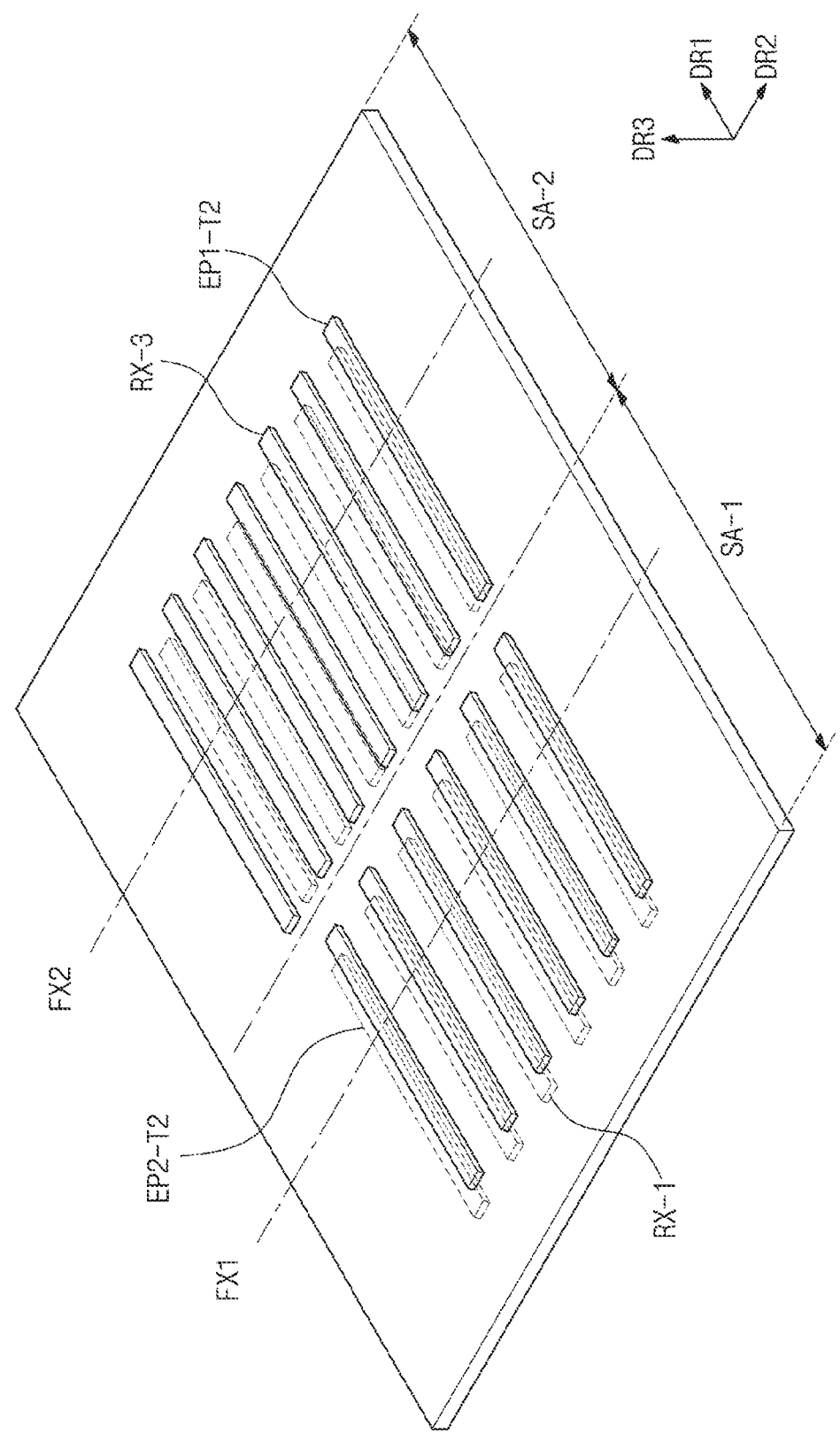
FIG. 12B is a perspective view of the first and second electrode patterns respectively spaced apart from the first and third touch electrodes according to an exemplary embodiment.

Referring to FIGS. 11A and 12B, the first conductive patterns CDP-1 may include the first touch electrodes RX-1 extending in the first direction DR1 and arranged in the second direction DR2 and the second touch electrodes TX-2 extending in the second direction DR2 and arranged in the first direction DR1. The second conductive patterns CDP-2 may include the third touch electrodes RX-3 extending in the first direction DR1 and arranged in the second direction DR2 and the fourth touch electrodes TX-4 extending in the second direction DR2 and arranged in the first direction DR1.

Referring to FIG. 11B, the first electrode patterns EP1-T1 may overlap the second area SA2, extend in the first direction DR1, and arranged in the second direction DR2. The second electrode patterns EP2-T1 may overlap the first area SA1, extend in the first direction DR1, and arranged in the second direction DR2.

The electrode patterns according to an exemplary embodiment may be connected to the touch electrodes as illustrated in FIG. 11B. More particularly, the first electrode patterns EP1-T1 may be integrally formed with the first touch electrodes RX-1, and the second electrode patterns EP2-T1 may be integrally formed with the third touch electrodes RX-3. The first electrode patterns EP1-T1 may have an integral shape respectively with the first touch electrodes RX-1, and the second electrode patterns EP2-T1 may have an integral shape respectively with the third touch electrodes RX-3.

Referring to FIG. 12B, the first electrode patterns EP1-T2 may be disposed to be spaced apart from the first touch electrodes RX-1, and the second electrode patterns EP2-T2 may be disposed to be spaced apart from the third touch electrodes RX-3.

The first electrode patterns EP1-T1 and EP1-T2 may not overlap the third touch electrodes RX-3 in the third direction DR3. That is, in the second area SA-2, the first electrode patterns EP1-T1 and EP1-T2 may be disposed to be dislocated (or may not overlap) with respect to the third touch electrodes RX-3 in an area where the third touch electrodes RX-3 are not disposed. Similarly, the second electrode patterns EP2-T1 and EP2-T2 may not overlap the first touch electrodes RX-1 in the third direction DR3. That is, in the first electrode patterns EP1-T1 and EP1-T2 and the second electrode patterns EP2-T1 and EP2-T2, dummy patterns may be formed on the first and second touch electrodes RX-1 and RX-3 to prevent the touch electrodes from being seen from the outside.

Although FIGS. 11A to 12B illustrate that the first and second electrode patterns EP1-T1 and EP1-T2 and EP2-T1 and EP2-T2 are formed as the dummy patterns on the first and second touch electrodes RX-1 and RX-3, however, the inventive concept is not limited thereto. For example, the dummy patterns may be formed to correspond to the second touch electrodes TX-2 and the fourth touch electrodes TX-4.

In the flexible display device according to the exemplary embodiments, the conductive patterns of the touch sensing unit may be disposed at positions where the compression force is applied, when the flexible display device is bent multiple times along different folding axes, in order to reduce generation of cracks in the conductive patterns. Further, the conductive patterns may include touch electrodes having the mesh shape with the plurality of openings to improve the flexibility of the flexible display device.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A flexible display device comprising:
   a display panel configured to display an image and comprising a first bending area and a second bending area, the first bending area and the second bending area being configured to be bent along a first folding axis and a second folding axis, respectively; and
   a touch sensing unit disposed on the display panel, the touch sensing unit comprising:
   a base insulation layer;
   a first touch electrode part disposed under the base insulation layer and overlapping the first bending area to detect an external input; and
   a second touch electrode part disposed over the base insulation layer and overlapping the second bending area to detect an external input,
   wherein a portion of the display panel is disposed between the first folding axis and the touch sensing unit, and a portion of the touch sensing unit is disposed between the second folding axis and the display panel, when the flexible display device is bent; and
   wherein the first touch electrode part comprises first conductive patterns that do not overlap the second bending area; and
   the second touch electrode part comprises second conductive patterns that do not overlap the first bending area.

2. The flexible display device of claim 1, wherein each of the first and second conductive patterns comprises a plurality of electrodes arranged in a matrix shape on a plane defined by a first direction and a second direction perpendicular to the first direction.

3. The flexible display device of claim 1, wherein each of the first and second conductive patterns has a mesh shape and comprising a plurality of openings.

4. The flexible display device of claim 1, wherein:
   the first conductive patterns comprise:
      first touch electrodes extending in a first direction and arranged in a second direction perpendicular to the first direction; and
      second touch electrodes extending in the second direction, arranged in the first direction, and insulated from the first touch electrodes; and
   the second conductive patterns comprise:
      third touch electrodes extending in the first direction and arranged in the second direction; and
      fourth touch electrodes extending in the second direction, arranged in the first direction, and insulated from the third touch electrodes.

5. The flexible display device of claim 4, wherein:
   the first touch electrodes and the second touch electrodes are disposed on different layers from each other in a third direction perpendicular to a plane defined by the first and second directions; and
   the third touch electrodes and the fourth touch electrodes are disposed on different layers different from each other in the third direction.

6. The flexible display device of claim 1, wherein:
   the touch sensing unit further comprises:
      a circuit board disposed on the base insulation layer;
      first signal lines connected to the first conductive patterns, respectively; and
      second signal lines connected to the second conductive patterns, respectively; and
   the first and second signal lines are each connected to the circuit board.

7. The flexible display device of claim 6, wherein:
   the first signal lines overlap the first and second bending areas; and
   the second signal lines do not overlap the first bending area and overlap the second bending area.

8. The flexible display device of claim 6, wherein:
   the circuit board comprises a first circuit board disposed on a first side of the base insulation layer and a second circuit board disposed on a second side facing the first side of the base insulation layer;
   each of the first signal lines is connected to the first circuit board; and each of the second signal lines is connected to the second circuit board.

9. The flexible display device of claim 4, wherein the touch sensing unit further comprises:
first electrode patterns disposed over the base insulation layer, overlapping the second bending area, extending in the first direction, and arranged in the second direction; and
second electrode patterns disposed under the base insulation layer, overlapping the first bending area, extending in the first direction, and arranged in the second direction.

10. The flexible display device of claim 9, wherein:
the first electrode patterns has an integral shape with the first touch electrodes, respectively; and
the second electrode patterns has an integral shape with the second touch electrodes, respectively.

11. The flexible display device of claim 9, wherein:
the first electrode patterns do not overlap the third touch electrodes in a third direction perpendicular to a plane defined by the first and second directions; and
the second electrode patterns do not overlap the first touch electrodes in the third direction.

12. A flexible display device comprising:
a display panel comprising a base substrate, a circuit layer disposed on the base substrate, a device layer disposed on the circuit layer, and an encapsulation layer covering the device layer, wherein the display panel has a first bending area configured to be bent along a first folding axis and a second bending area configured to be bent along a second folding axis; and
a touch sensing unit comprising:
a base insulation layer;
first conductive patterns disposed on the encapsulation layer and under the base insulation layer, the first conductive patterns overlapping the first bending area and not overlapping the second bending area; and
second conductive patterns disposed over the base insulation layer, the second conductive patterns overlapping the second bending area and not overlapping the first bending area,
wherein a portion of the display panel is disposed between the first folding axis and the touch sensing unit, and a portion of the touch sensing unit is disposed between the second folding axis and the display panel, when the flexible display device is bent.

13. The flexible display device of claim 12, further comprising an adhesion layer disposed between the encapsulation layer and the first conductive patterns.

14. The flexible display device of claim 12, wherein:
the first conductive patterns comprise:
first touch electrodes extending in a first direction and arranged in a second direction perpendicular to the first direction; and
second touch electrodes extending in the second direction and arranged in the first direction; and
the second conductive patterns comprise:
third touch electrodes extending in the first direction and arranged in the second direction; and
fourth touch electrodes extending in the second direction and arranged in the first direction.

15. The flexible display device of claim 14, wherein:
the first touch electrodes and the second touch electrodes are disposed on different layers different from each other in a third direction perpendicular to a plane defined by the first and second directions; and
the third touch electrodes and the fourth touch electrodes are disposed on different layers different from each other in the third direction.

16. The flexible display device of claim 14, wherein the touch sensing unit further comprises:
first electrode patterns disposed between the encapsulation layer and the base insulation layer, overlapping the second bending area, extending in the first direction, and arranged in the second direction; and
second electrode patterns disposed on the base insulation layer, overlapping the first bending area, extending in the first direction, and arranged in the second direction.

17. The flexible display device of claim 16, wherein:
the first electrode patterns do not overlap the third touch electrodes in a third direction perpendicular to a plane defined by the first and second directions; and
the second electrode patterns do not overlap the first touch electrodes in the third direction.

18. A method of manufacturing a flexible display device, the method comprising:
providing a display panel; and
forming a touch sensing unit on the display panel, comprising:
forming a base insulation layer comprising a first bending area and a second bending area, the first bending area configured to be bent along a first folding axis and a second bending area configured to be bent along a second folding axis;
forming a first touch electrode part overlapping the first bending area under the base insulation layer; and
forming a second touch electrode part overlapping the second bending area over the base insulation layer,
wherein a portion of the display panel is disposed between the first folding axis and the touch sensing unit, and a portion of the touch sensing unit is disposed between the second folding axis and the display panel, when the flexible display device is bent; and
wherein the first touch electrode part comprises first conductive patterns that do not overlap the second bending area; and
the second touch electrode part comprises second conductive patterns that do not overlap the first bending area.

19. The method of claim 18, further comprising forming an adhesion layer on the display panel,
wherein the adhesion layer adheres the display panel to the touch sensing unit.

* * * * *